US012765014B2

(12) United States Patent
Mazza et al.

(10) Patent No.: US 12,765,014 B2
(45) Date of Patent: Oct. 13, 2026

(54) STACKED DEVICE STRUCTURES WITH VARYING LAYER CHARACTERISTICS

(71) Applicant: International Business Machines Corporation, Armonk, NY (US)

(72) Inventors: James P. Mazza, Saratoga Springs, NY (US); Ruilong Xie, Niskayuna, NY (US); Shay Reboh, Guilderland, NY (US); Reinaldo Vega, Mahopac, NY (US); Nicholas Anthony Lanzillo, Wynantskill, NY (US); Takashi Ando, Eastchester, NY (US); David Wolpert, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 363 days.

(21) Appl. No.: 18/537,444

(22) Filed: Dec. 12, 2023

(65) Prior Publication Data

US 2025/0194182 A1 Jun. 12, 2025

(51) Int. Cl.

| | |
|---|---|
| ***H01L 21/78*** | (2006.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10D 84/01*** | (2025.01) |
| ***H10D 84/03*** | (2025.01) |

(Continued)

(52) U.S. Cl.
CPC ......... *H10D 62/121* (2025.01); *H10D 30/014* (2025.01); *H10D 30/43* (2025.01); *H10D 30/6735* (2025.01); *H10D 30/6757* (2025.01); *H10D 64/017* (2025.01); *H10D 84/0167* (2025.01); *H10D 84/038* (2025.01); *H10D 84/85* (2025.01); *H10W 90/00* (2026.01)

(58) Field of Classification Search
CPC .... H10D 62/121; H10D 30/014; H10D 30/43; H10D 30/6735; H10D 30/6757; H10D 64/017; H10D 84/0167; H10D 84/038; H10D 84/85; H10D 84/83; H10D 88/00; H10D 88/01; H10W 90/00
USPC .......................................................... 257/288
See application file for complete search history.

(56) References Cited

U.S. PATENT DOCUMENTS 10,037,397 B2 7/2018 Moroz et al.
10,101,359 B2 * 10/2018 Onda ............. G01R 31/318538
(Continued)

FOREIGN PATENT DOCUMENTS

WO 2023099000 6/2023

*Primary Examiner* — Vu A Vu
(74) *Attorney, Agent, or Firm* — Ryan, Mason & Lewis, LLP

(57) ABSTRACT

A semiconductor device includes a first stacked field-effect transistor structure having a first lower field-effect transistor device and a first upper field-effect transistor device. The semiconductor device also includes a second stacked field-effect transistor structure comprising a second lower field-effect transistor device and a second upper field-effect transistor device, where at least one of: the first lower field-effect transistor device includes a different number of channel layers than the second lower field-effect transistor device; and the first upper field-effect transistor device includes a different number of channel layers than the second upper field-effect transistor device.

20 Claims, 14 Drawing Sheets

(51) Int. Cl.

| | |
|---|---|
| ***H10D 84/85*** | (2025.01) |
| ***H10W 90/00*** | (2026.01) |

(56) References Cited

U.S. PATENT DOCUMENTS

| | | | | |
|---|---|---|---|---|
| 10,192,867 | B1 | 1/2019 | Frougier et al. | |
| 10,381,438 | B2 * | 8/2019 | Zhang | H10D 62/121 |
| 10,424,580 | B2 | 9/2019 | Cappellani et al. | |
| 10,700,064 | B1 * | 6/2020 | Zhang | H10D 84/83 |
| 10,734,447 | B2 * | 8/2020 | Ando | H10N 70/021 |
| 10,879,352 | B2 * | 12/2020 | Zhang | H10D 62/121 |
| 10,886,368 | B2 * | 1/2021 | Zhang | H10D 62/121 |
| 11,075,198 | B2 | 7/2021 | Lilak et al. | |
| 11,158,544 | B2 * | 10/2021 | Cheng | H10D 64/017 |
| 11,532,617 | B2 * | 12/2022 | Tsao | H10D 84/83 |
| 11,569,231 | B2 | 1/2023 | Snyder et al. | |
| 11,664,373 | B2 * | 5/2023 | Lilak | H10D 88/00<br>257/401 |
| 12,294,005 | B2 * | 5/2025 | Shin | H10D 30/6757 |
| 2021/0233909 | A1 * | 7/2021 | Bao | H10D 84/0167 |
| 2022/0044973 | A1 * | 2/2022 | Cheng | H10D 64/017 |
| 2022/0336455 | A1 | 10/2022 | Lin et al. | |
| 2022/0367658 | A1 | 11/2022 | Yim et al. | |
| 2023/0086084 | A1 | 3/2023 | Yun et al. | |
| 2023/0137307 | A1 | 5/2023 | Chen et al. | |
| 2023/0343823 | A1 * | 10/2023 | Baek | H10D 30/43 |

* cited by examiner

STACKED DEVICE STRUCTURES WITH VARYING LAYER CHARACTERISTICS

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments described herein provide techniques for stacked device structures with varying layer characteristics.

In one embodiment, a semiconductor device comprises a first stacked field-effect transistor structure comprising a first lower field-effect transistor device and a first upper field-effect transistor device, and a second stacked field-effect transistor structure comprising a second lower field-effect transistor device and a second upper field-effect transistor device, where at least one of the first lower field-effect transistor device comprises a different number of channel layers than the second lower field-effect transistor device and the first upper field-effect transistor device comprises a different number of channel layers than the second upper field-effect transistor device.

Advantageously, the semiconductor device disclosed above comprising the first stacked field-effect transistor and the second stacked field-effect transistor structures enables the number of channel layers of upper and/or lower devices in the same stacked architecture to be varied within the same stacked architecture, thereby providing increased control over power tuning and/or beta ratios.

As may be combined with the preceding paragraph, the first lower field-effect transistor and the first upper field-effect transistor device may include a same number of channel layers.

As may be combined with the preceding paragraphs, at least some of the channel layers in the first stacked field-effect transistor structure have different widths.

As may be combined with the preceding paragraphs, at least one of the first and second upper field-effect transistor devices may include at least one first upper channel layer and at least one second upper channel layer having different widths.

As may be combined with the preceding paragraphs, at least one of the first and second lower field-effect transistor devices may include at least one first lower channel layer and at least one second lower channel layer having different widths.

As may be combined with the preceding paragraphs, the channel layers corresponding to the first upper field-effect transistor device, the channel layers corresponding to the first lower field-effect transistor device, and an isolation layer disposed between the first lower field-effect transistor device and the first upper field-effect transistor device may be alternately stacked with a plurality of gate structures of the first stacked field-effect transistor structure.

As may be combined with the preceding paragraphs, the first lower field-effect transistor and the first upper field-effect transistor device comprise a same number of channel layers, and where the channel layers in the first stacked field-effect transistor structure have one or more different widths.

In another embodiment, a semiconductor device comprises a plurality of stacked device structures comprising two or more upper devices, each comprising one or more upper channel layers, and two or more lower devices, each comprising one or more lower channel layers. A first number of upper channel layers of a first one of the two or more upper devices is different than a second number of upper channel layers of a second one of the two or more upper devices. A third number of lower channel layers of a first one of the two or more lower devices is different than a fourth number of lower channel layers of a second one of the two or more lower devices.

Advantageously, the semiconductor device disclosed above comprising the plurality of stacked device structures enables the number of channel layers of upper and/or lower devices in the same stacked architecture to be varied within the same stacked architecture, thereby providing increased control over power tuning and/or beta ratios.

As may be combined with the preceding paragraph, at least one of the upper devices may include at least one first upper channel layer and at least one second upper channel layer having different widths.

As may be combined with the preceding paragraphs, at least one of the lower devices may include at least one first lower channel layer and at least one second lower channel layer having different widths.

As may be combined with the preceding paragraphs, a given one of the stacked device structures may include an isolation layer disposed between the one or more upper devices and the one or more lower devices of the given stacked device structure.

As may be combined with the preceding paragraphs, the first and second upper devices and the first and second lower devices may include respective field-effect transistor devices.

As may be combined with the preceding paragraphs, the first and second upper devices and the first and second lower devices may include respective nanosheet field-effect transistor devices.

As may be combined with the preceding paragraphs, a first stacked device structure and a second stacked device structure provide a complementary field-effect transistor structure.

As may be combined with the preceding paragraphs, one of the first upper device and the first lower device in the first stacked device structure may include an n-type field-effect transistor device and the other one of the first upper device and the second lower device in the first stacked device structure may include a p-type field-effect transistor device.

In another embodiment, a method includes forming first and second stacked field-effect transistor device structures, each of the first and second stacked field-effect transistor device structures comprising a plurality of channel layers corresponding to an upper field-effect transistor device and a lower field-effect transistor device. The method also includes removing at least one channel layer from the plurality of channel layers of the first stacked field-effect transistor device structure, where the removing results in at least one of; a first number of channel layers of the lower field-effect transistor device corresponding to the first stacked field-effect transistor device structure being different than a second number of channel layers of the lower field-effect transistor device corresponding to the second stacked field-effect transistor device structure; and a third number of channel layers of the upper field-effect transistor device corresponding to the first stacked field-effect transistor device structure being different than a fourth number of channel layers of the upper field-effect transistor device corresponding to the second stacked field-effect transistor device structure.

As may be combined with the preceding paragraph, removing the at least one channel layer from the plurality of channel layers of the first stacked field-effect transistor device structure may include forming a mask layer to cover at least the upper field-effect transistor device of the second stacked field-effect transistor device structure, performing a first etching process that etches through the at least one channel layer corresponding to the upper field-effect transistor device of the first stacked field-effect transistor device structure, and performing a second etching process to remove at least the mask layer.

Advantageously, the method disclosed above can vary the number of channel layers of upper and/or lower devices in the same stacked architecture, thereby providing increased control over power tuning and/or beta ratios.

As may be combined with the preceding paragraphs, the method may further include forming a gate stack layer around the remaining channel layers of the first and second stacked field-effect transistor device structures.

As may be combined with the preceding paragraphs, removing the at least one channel layer from the plurality of channel layers of the first stacked field-effect transistor device structure may include forming a mask layer to cover at least the lower field-effect transistor device of the second stacked field-effect transistor device structure, performing a first etching process that etches through a portion of a gate stack layer and the at least one channel layer corresponding to the lower field-effect transistor device of the first stacked field-effect transistor device structure, and performing a second etching process to remove at least the mask layer.

As may be combined with the preceding paragraphs, the method may further include forming a dielectric layer that covers exposed portions of the gate stack layer of the first stacked field-effect transistor device structure and a gate stack layer of the first stacked field-effect transistor device structure resulting from the first and second etching processes.

As may be combined with the preceding paragraphs, the lower field-effect transistor devices may include one of n-type field-effect transistor devices and p-type field-effect transistor devices, and the upper field-effect transistor devices may include the other one of the n-type field-effect transistor devices and the p-type field-effect transistor devices.

These and other features and advantages of embodiments described herein will become more apparent from the accompanying drawings and the following detailed description.

DETAILED DESCRIPTION

Figure 1:
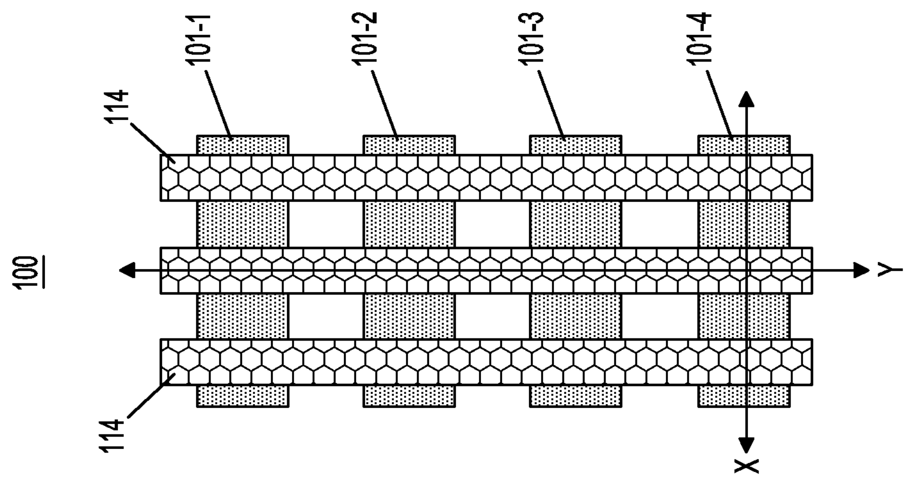
FIG. 1 depicts a top view of a semiconductor structure with lines X and Y on which the cross-sectional views of FIGS. 2A-14 are based, according to an illustrative embodiment.

Illustrative embodiments are described herein in the context of illustrative methods for stacked device structures with varying layer characteristics, along with illustrative apparatus, systems and devices formed using such methods. However, it is to be understood that embodiments described herein are not limited to the illustrative methods, apparatus, systems, and devices but instead are more broadly applicable to other suitable methods, apparatus, systems and devices.

It is noted that the term "layer characteristics" as used herein is intended to be broadly construed so as to encompass, for example, a number and/or a width of channel layers.

It is to be understood that the various features shown in the accompanying drawings are schematic illustrations that are not necessarily drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

A FET is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Various techniques may be used to reduce the size of FETs. One technique is through the use of fin-shaped channels in fin field-effect transistors (FinFET). Before the advent of FinFET arrangements, CMOS devices were typically substantially planar along the surface of the semiconductor substrate, with the exception of the FET gate disposed over the top of the channel. FinFETs utilize a vertical channel structure, increasing the surface area of the channel exposed to the gate. Thus, in FinFET structures the gate can more effectively control the channel, as the gate extends over more than one side or surface of the channel. In some FinFET arrangements, the gate encloses three surfaces of the three-dimensional channel, rather than being disposed over just the top surface of a traditional planar channel.

Another technique useful for reducing the size of FETs is through the use of stacked nanosheet channels formed over a semiconductor substrate. Stacked nanosheets may be two-dimensional nanostructures, such as sheets having a thickness range on the order of 1 to 100 nanometers (nm). Nanosheets and nanowires are viable options for scaling to 7 nm and beyond. A general process flow for formation of a nanosheet stack involves selectively removing sacrificial layers, which may be formed of silicon germanium (SiGe), between sheets of channel material, which may be formed of silicon (Si).

For continued scaling (e.g., to 2.5 nm and beyond), next-generation stacked FET (SFET) devices may be used. Next-generation SFET devices provide a complex gate-all-around (GAA) structure. Conventional GAA FETs, such as nanosheet FETs, may stack multiple p-type nanowires or nanosheets on top of each other in one device, and may stack multiple n-type nanowires or nanosheets on top of each other in another device. Next-generation SFET structures provide improved track height scaling, leading to structural gains (e.g., such as 30-40% structural gains for different types of devices, such as logic devices, static random-access memory (SRAM) devices, etc.). In next-generation SFET structures, n-type and p-type nanowires or nanosheets are stacked on each other, eliminating n-to-p separation bottlenecks and reducing the device area footprint. There is, however, a continued desire for further scaling and reducing the size of FETs.

As discussed above, various techniques may be used to reduce the size of FETs, including using fin-shaped channels in FinFET devices, using stacked nanosheet channels formed over a semiconductor substrate, and using next-generation SFET devices.

Although embodiments described herein are discussed in connection with nanosheet stacks, the embodiments are not necessarily limited thereto, and may similarly apply to nanowire stacks.

In some embodiments, microelectronic and other semiconductor structures with a different number of upper level and/or lower level nanosheets may be formed using the following processing. A top CMOS device layer is formed over a bottom CMOS device layer, and MOL contacts are formed over the top of the CMOS layer, where a deep via contact is formed between one or more CMOS cells. A BEOL interconnect is formed over the MOL contacts and the deep via contact. A carried wafer is bonded, which is then used to flip the wafer so that portions of a substrate of the structure can be removed. Backside contacts are formed, and then backside interconnects to the backside contacts and the deep via contacts are then formed, as described in more detail elsewhere herein.

FIG. 1 depicts a top view of a semiconductor structure 100 with lines X and Y on which the cross-sectional views of FIGS. 2A-14 are based, according to an illustrative embodiment. More specifically, FIG. 1 illustrates a set of stacked cells 101-1, 101-2, 101-3 and 101-4 (collectively, stacked cells 101), and dummy gates portions 114 formed across the stacked cells 101.

Figure 2B:
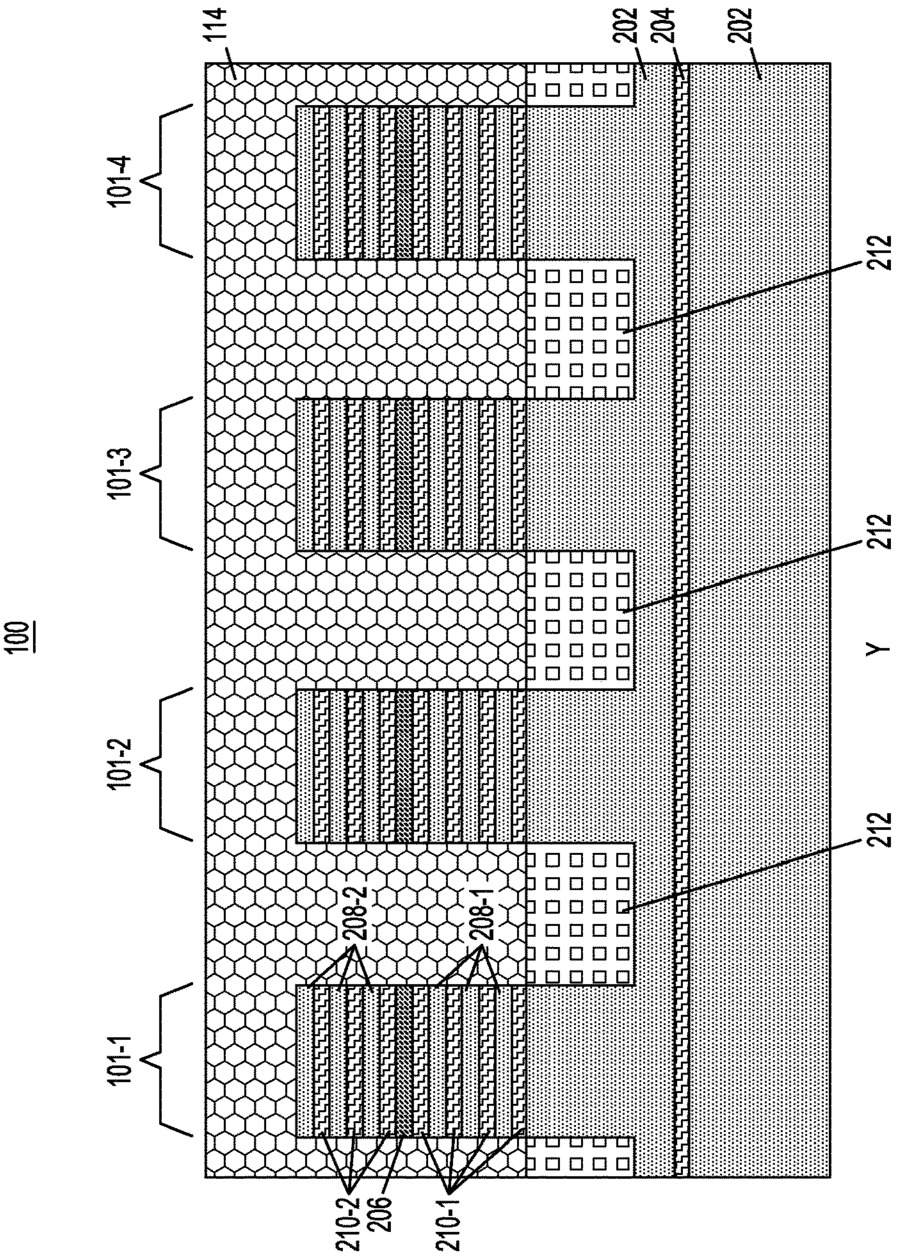
FIG. 2B depicts a second cross-sectional view corresponding to line Y in FIG. 1 illustrating the semiconductor structure following the front-end-of-line (FEOL) process, according to an illustrative embodiment.
Figure 2A:
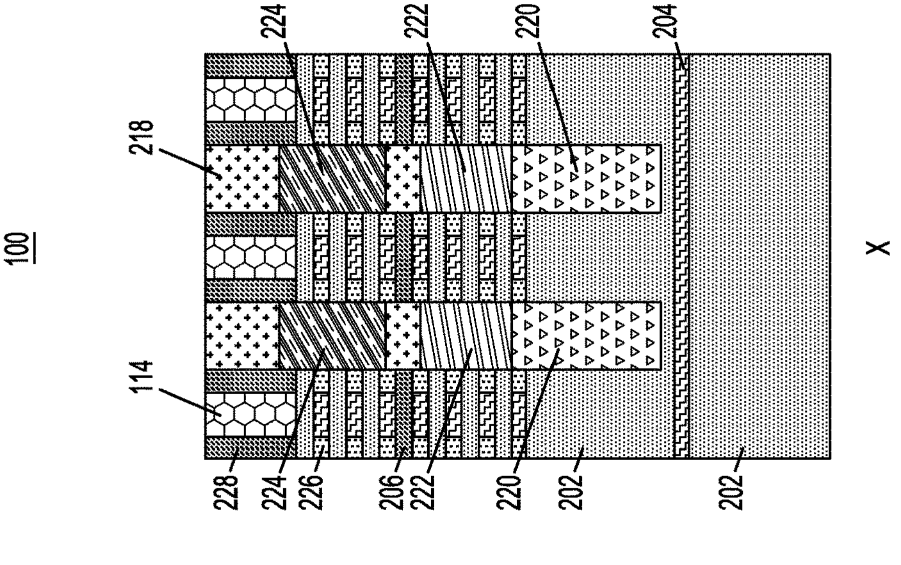
FIG. 2A depicts a first cross-sectional view corresponding to line X in FIG. 1 illustrating the semiconductor structure following a front-end-of-line (FEOL) process, according to an illustrative embodiment.

FIGS. 2A and 2B show cross-sectional views of the semiconductor structure 100, respectively corresponding to lines X and Y in FIG. 1, following a front-end-of-line (FEOL) process, according to an illustrative embodiment. FIG. 2A shows a first side cross-sectional view 200 of a structure, following formation of nanosheet channel layers 208-1 and 208-2 over a substrate 202.

As used herein, "frontside or "first side" refers to a side on top of the semiconductor substrate 202 and/or in front of, on top of or in an upward direction from the stacked gate and channel layers of the transistors in the orientation shown in the cross-sectional figures. As used herein, "backside" or "second side" refers to a side below the semiconductor substrate 202 and/or behind, below or in a downward direction from the stacked gate and channel layers of the transistors in the orientation shown in the cross-sectional figures (e.g., opposite the "frontside").

The substrate 202 may be formed of any suitable semiconductor structure, including various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), and zinc selenide (ZnSe).

An etch stop layer 204 is formed in the substrate 202. The etch stop layer 204 may comprise a buried oxide (BOX) layer or silicon germanium (SiGe), or another suitable material such as a III-V semiconductor epitaxial layer. In some embodiments, the etch stop layer 204 can have a height in the range of 10 to 30 nm.

For example, to form the structure shown in FIGS. 2A and 2B, nanosheets are formed over the substrate 202, where the nanosheets include nanosheet channel layers 208-1 and 208-2 (collectively, nanosheet channel layers 208) and sacrificial layers 210-1 and 210-2 (collectively, sacrificial layers 210).

The nanosheet channel layers 208 may be formed of Si or another suitable material (e.g., a material similar to that used for the substrate 202). Each of the nanosheet channel layers 208 may have a thickness in the range of 4 to 10 nm.

The sacrificial layers 210 and the nanosheet channel layers 208 are epitaxially grown in an alternating and stacked configuration on the substrate 202. In the example shown in FIGS. 2A and 2B, four sacrificial layers 210-1 and three nanosheet channel layers 208-1 are epitaxially grown in an alternating manner, followed another sacrificial layer (which has been replaced by middle dielectric insulator (MDI) layer 206 in FIGS. 2A and 2B), followed by three sacrificial layers 210-2 and three nanosheet channel layers 208-2 that are epitaxially grown in an alternating manner.

It is to be appreciated that the sacrificial layers 210, the sacrificial layer used to form the MDI layer 206, and the nanosheet channel layers 208 are epitaxially grown from their corresponding underlying semiconductor layers.

While seven sacrificial layers 210 and six nanosheet channel layers 208 are shown, embodiments described herein are not necessarily limited to the shown number of sacrificial layers 210 and nanosheet channel layers 208, and there may be more or less layers in the same alternating configuration depending on design constraints. The sacrificial layers 210, as described further herein, are eventually removed and replaced by gate structures.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

Portions of, for example, the sacrificial layers 210 and nanosheet channel layers 208 have been removed, and portions of the substrate 202 have been removed and recessed to form isolation regions 212 (e.g., shallow trench isolation (STI)) regions are formed in the recessed portions of the substrate 202 between the remaining nanosheet stacks). In some embodiments, the isolation regions 104 can comprise dielectric material fill in the recessed portions of the substrate 102. The dielectric material can comprise for example, one or more dielectrics, including, but not necessarily limited to ($SiO_x$) (where x is for example, 2, 1.99 or 2.01), silicon oxycarbide (SiOC), silicon nitride (SiN), silicon oxynitride (SiON), silicon-carbon-nitride (SiCN), boron nitride (BN), silicon boron nitride (SiBN), silicoboron carbonitride (SiBCN), silicon oxycarbonitride (SiOCN), or some other dielectric.

The semiconductor structure 100 also includes a topside ILD layer 218, sacrificial placeholders 220, bottom source/drain regions 222, top source/drain regions 224, inner spacers 226, and sidewall spacers 228. For the semiconductor structure 100 shown in FIGS. 2A and 2B, dummy gates portions 114 are first formed over the nanosheets. The MDI layer 206 and sidewall spacers 228 are then formed. It is assumed that the MDI layer 206 has been formed by selectively etching and removing a sacrificial layer that is formed of different sacrificial materials than the sacrificial layers 210, such that it can be etched or otherwise removed selective to the sacrificial layers 210. In some embodiments, the sacrificial layer that is used to form the MDI layer 206 and the sacrificial layers 210 can both be formed of SiGe, but with different percentages of Ge. As a non-limiting example, the sacrificial layer used to form the MDI layer 206 can have a relatively higher percentage of Ge (e.g., 55% Ge), and the sacrificial layers 210 may have a relatively lower percentage of Ge (e.g., 25% Ge). Other combinations of different sacrificial materials may be used in other embodiments. The sacrificial layers used to form the MDI layer 206 and the sacrificial layers 210 may each have a thickness in the range of 6 to 20 nm, for example.

The MDI layer 206 material, in some embodiments, can be deposited in place of the corresponding sacrificial layer using deposition techniques such as, for example, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), followed by an etch back to form the MDI layer 206. The MDI layer 206 may comprise, for example, $SiO_x$, SiOC, SiN, SiON, SiCN, BN, SiBN, SiBCN, SiOCN, and/or some other dielectric.

Dummy gate portions 114 are formed on the uppermost nanosheet channel layers 208-2 and around the stacked nanosheet configurations of the MDI layer 206, sacrificial layers 210 and nanosheet channel layers 208. The dummy gate portions 114 include, but are not necessarily limited to, an amorphous silicon (a-Si) layer. The dummy gate portions 114 are deposited using deposition techniques such as, for example, CVD, PECVD, RFCVD, PVD, ALD, MBD, PLD, LSMCD, sputtering and/or plating, followed by a planarization process, such as, chemical mechanical planarization (CMP), and lithography and etching steps to remove excess dummy gate material, and pattern the deposited layer.

The exposed nanosheet stack and portions of the MDI layer 206 that are not covered by the dummy gate portions 114 or sidewall spacer 228 are recessed, followed by indentation of the sacrificial layers 210-1 and 210-2 and formation of inner spacers 226. Backside contact patterning is then used to form trenches into the substrate 202. The trenches are filled with sacrificial materials to form sacrificial placeholders 220. The bottom source/drain regions 222, top source/drain regions 224, and the ILD layer 218 are formed.

Figure 3B:
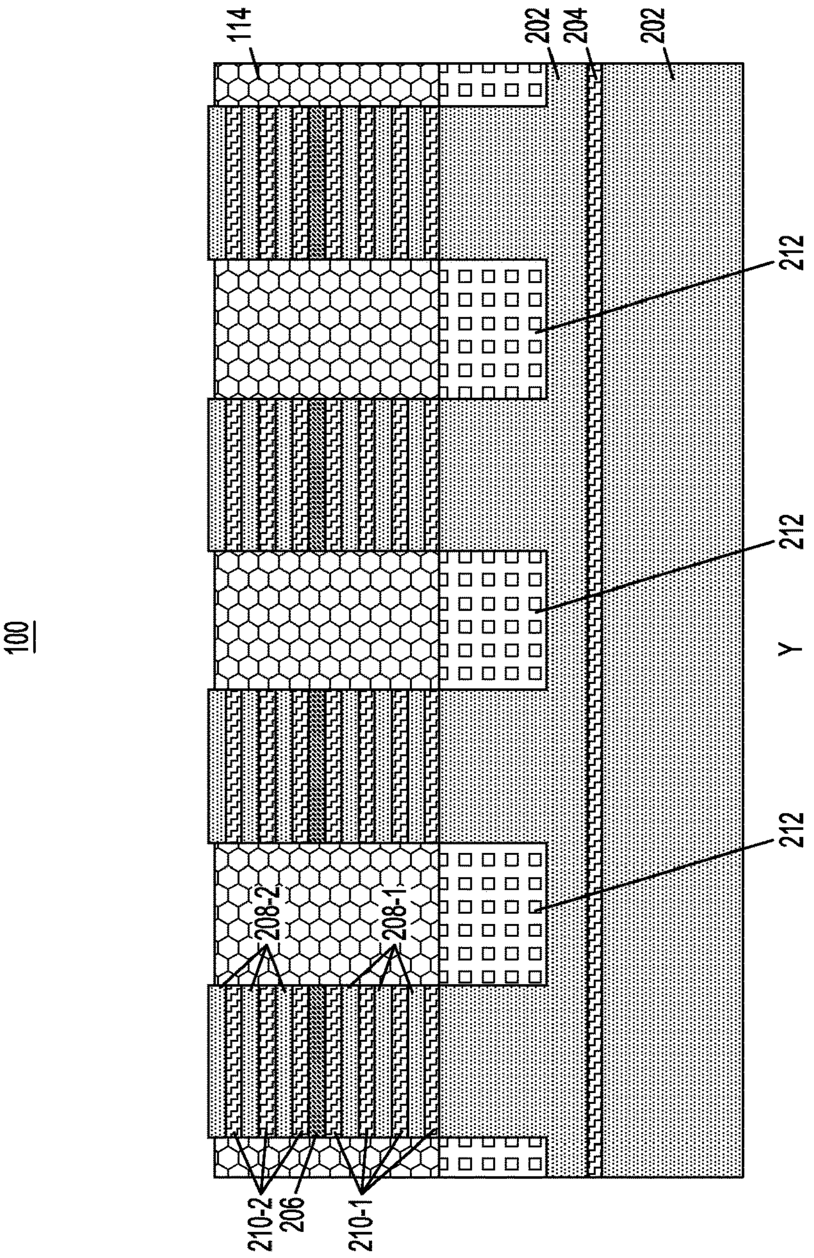
FIG. 3B depicts a second cross-sectional view corresponding to line Y in FIG. 1 illustrating the semiconductor structure following the partial dummy gate remove process, according to an illustrative embodiment.
Figure 3A:
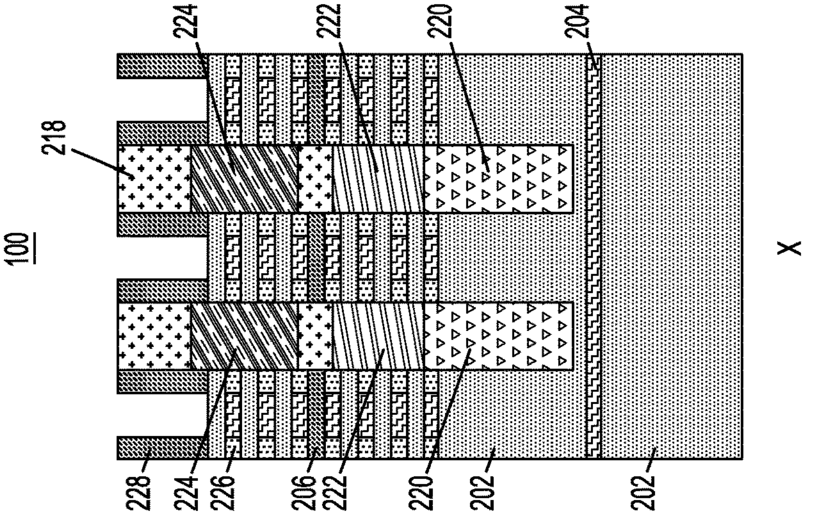
FIG. 3A depicts a first cross-sectional view corresponding to line X in FIG. 1 illustrating the semiconductor structure following a partial dummy gate remove process, according to an illustrative embodiment.

FIGS. 3A and 3B show cross-sectional views of the semiconductor structure 100, respectively corresponding to lines X and Y in FIG. 1, following partial recessing of the dummy gate portions 114, according to an illustrative embodiment. The dummy gate portions 114 can be recessed, for example, using any suitable etch processing which removes the portions of the dummy gate material selective to the materials of the remaining structure. More specifically, the dummy gate portions 114 of the semiconductor structure 100 shown in FIGS. 3A and 3B are partially recessed so as to expose the uppermost nanosheet channel layers 208-2 of the stacked nanosheet configurations.

Figures 4A, 4B:
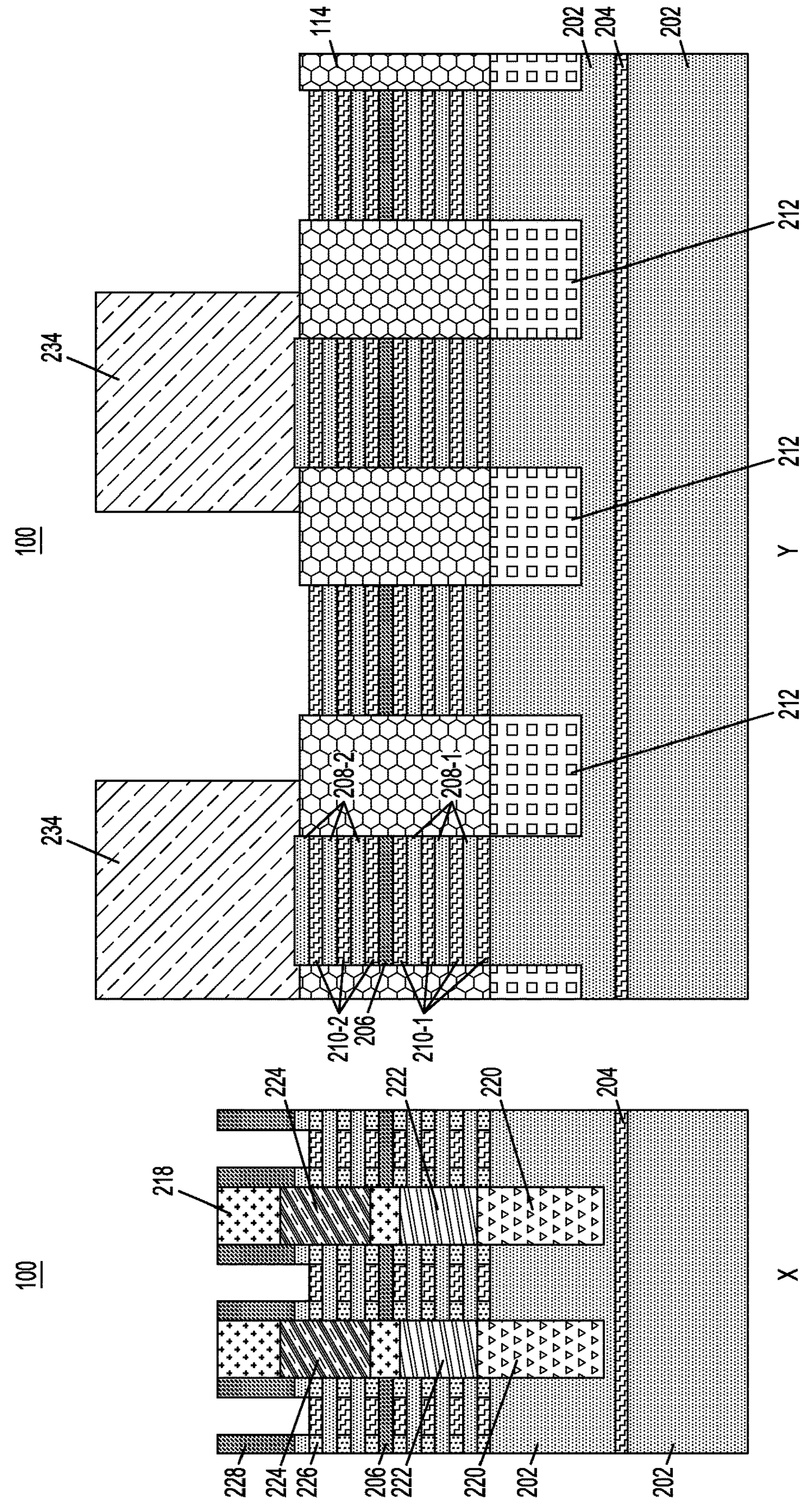
FIG. 4A depicts a first cross-sectional view corresponding to line X in FIG. 1 illustrating the semiconductor structure following a top channel depopulation process, according to an illustrative embodiment.
FIG. 4B depicts a second cross-sectional view corresponding to line Y in FIG. 1 illustrating the semiconductor structure following the top channel depopulation process, according to an illustrative embodiment.

FIGS. 4A and 4B show cross-sectional views of the semiconductor structure 100, respectively corresponding to lines X and Y in FIG. 1, following a top channel depopulation process, according to an illustrative embodiment. The term "depopulation process" as used herein refers to a process for removing one or more channel layers from a semiconductor structure (e.g., semiconductor structure 100). In this example, the top channel depopulation process can include depositing and selectively etching a mask layer 234 (e.g., an organic planarization layer (OPL)) so that one or more portions of the uppermost nanosheet channel layers 208-2 are exposed. In the example shown in FIGS. 4A and 4B, the mask layer 234 is deposited and etched such that it covers the uppermost nanosheet channel layers 208-2 corresponding to stacked cells 101-1 and 101-3 of the semiconductor structure 100, while exposing the uppermost nanosheet channel layers 208-2 corresponding to stacked cells 101-2 and 101-4. The top channel depopulation process also includes removing the exposed portions of the uppermost nanosheet channel layers 208-2. For example, the portions of the uppermost nanosheet channel layers 208-2 can be removed using any suitable etch processing which removes the materials of the nanosheet channel layers 208-2 selective to the materials of the remaining structure.

Figure 5B:
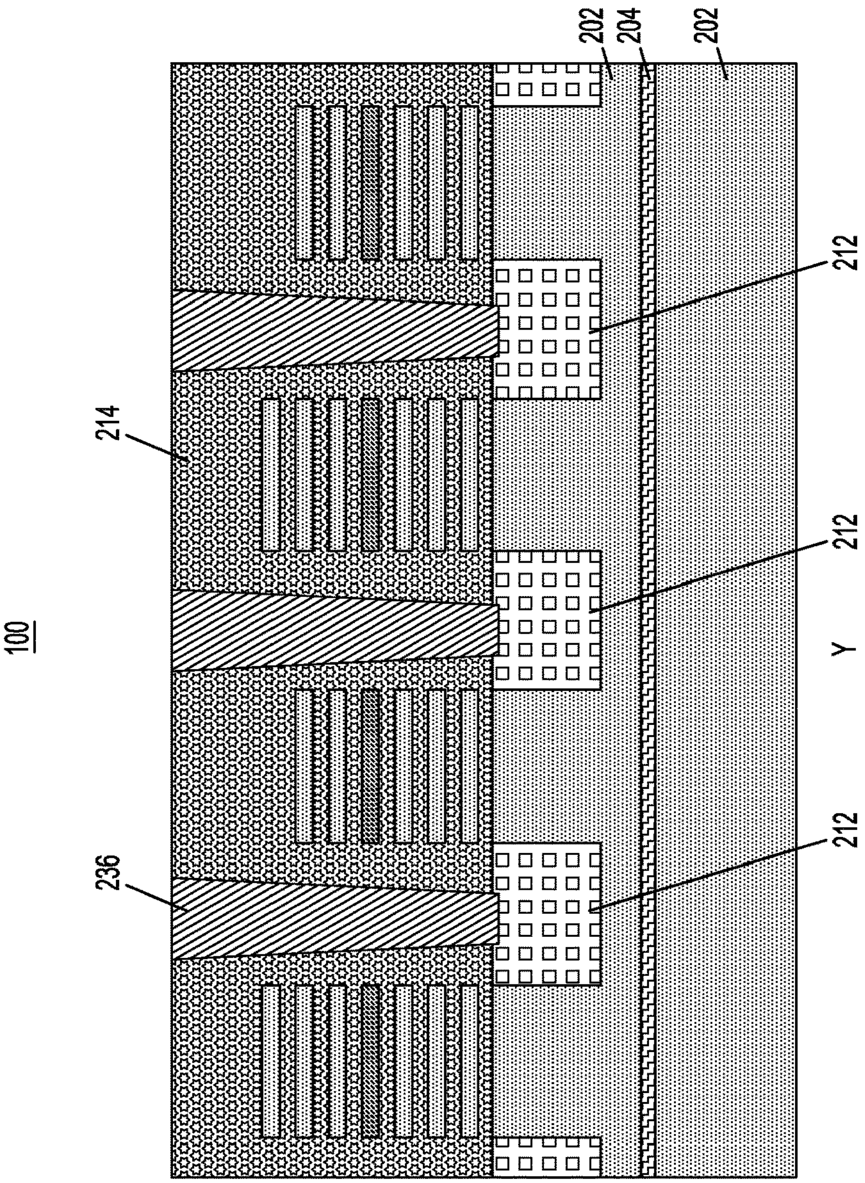
FIG. 5B depicts a second cross-sectional view corresponding to line Y in FIG. 1 illustrating the semiconductor structure following removal of the mask layer, dummy gates, and sacrificial layers, and following formation of the gate and gate cut regions, according to an illustrative embodiment.
Figure 5A:
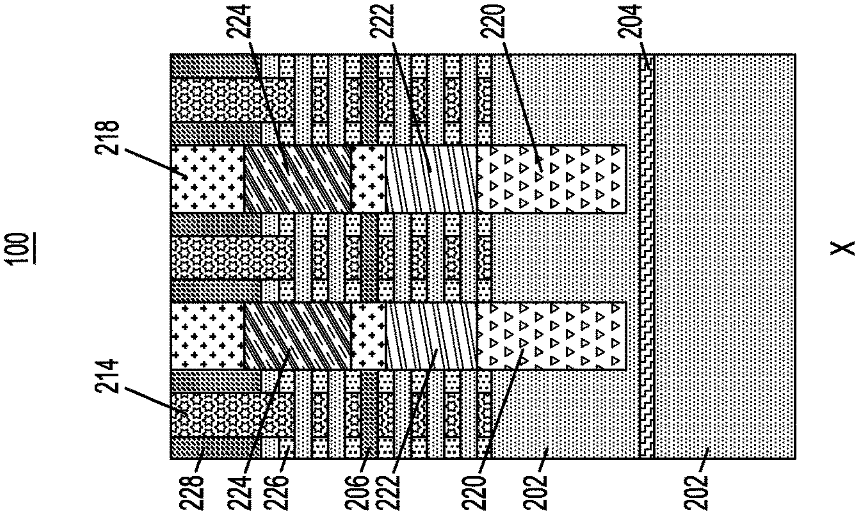
FIG. 5A depicts a first cross-sectional view corresponding to line X in FIG. 1 illustrating the semiconductor structure following removal of a mask layer, dummy gates, and sacrificial layers, and following formation of gate and gate cut regions, according to an illustrative embodiment.

FIGS. 5A and 5B show cross-sectional views of the semiconductor structure 100, respectively corresponding to lines X and Y in FIG. 1, following removal of the mask layer, dummy gates, and sacrificial layers, and following formation of the gate and gate cut regions, according to an illustrative embodiment. In the embodiment shown in FIGS. 5A and 5B, the mask layer 234 can be removed using any suitable etch processing which removes the materials of the mask layer 234 selective to the materials of the remaining structure. Following the removal of the mask layer 234, the remaining dummy gate portions 114 are selectively removed to create vacant areas, where gate structures will be formed in place of the dummy gate portions 114. The selective removal can be performed using, for example, hot ammonia to remove a-Si. In addition, the sacrificial layers 210 are selectively removed to create vacant areas where gate structures will be formed in place of the sacrificial layers 210. The sacrificial layers 210 can be selectively removed with respect to the nanosheet channel layers 208. The selective removal can be performed using, for example, a dry HCl etch.

In some embodiments, the gate stack layer 214 can be formed in the aforementioned vacant areas using high-k metal gate (HKMG) processing. For example, the gate stack layer 214 may comprise a gate dielectric layer and a gate conductor layer. The gate dielectric layer may be formed of a high-k dielectric material. Examples of high-k materials include but are not limited to metal oxides such as $HfO_2$, hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg). The gate dielectric layer may have a uniform thickness in the range of 1 nm to 3 nm.

The gate conductor layer may include a metal gate or work function metal (WFM). The WFM for the gate conductor layer may be titanium (Ti), titanium nitride (TiN), tantalum (Ta), tantalum nitride (TaN), aluminum (Al), titanium aluminum (TiAl), titanium aluminum carbon (TiAlC), a combination of Ti and Al alloys, a stack which includes a barrier layer (e.g., of TiN, TaN, etc.) followed by one or more of the aforementioned WFM materials, etc. It should be appreciated that various other materials may be used for the gate conductor layer as desired.

Parts of the gate layer 214 between the stacked cells 101 is removed down to the isolation region 212, and parts of the exposed portion of the isolation regions 212 are also removed to form trenches in which dielectric material is deposited to form gate cut portions 236. The parts of the gate layer 214 can be etched using, for example, RIE. The exposed portion of the isolation regions 212 are etched using, for example, RIE. The dielectric material of the gate cut portions 236 is deposited using deposition techniques such as, for example, CVD, PECVD, RFCVD, PVD, ALD, MBD, PLD, and/or LSMCD, followed by a planarization process, such as, CMP to remove excess portions of the dielectric material deposited on top of the gate layer 214. The dielectric material of the gate cut portion 236 may comprise, but is not necessarily limited to, SiN, SiC, SiON, SiOC, SiCN, BN, SiBN, SiBCN, SiOCN, $SiO_x$ or some other dielectric.

Figure 6B:
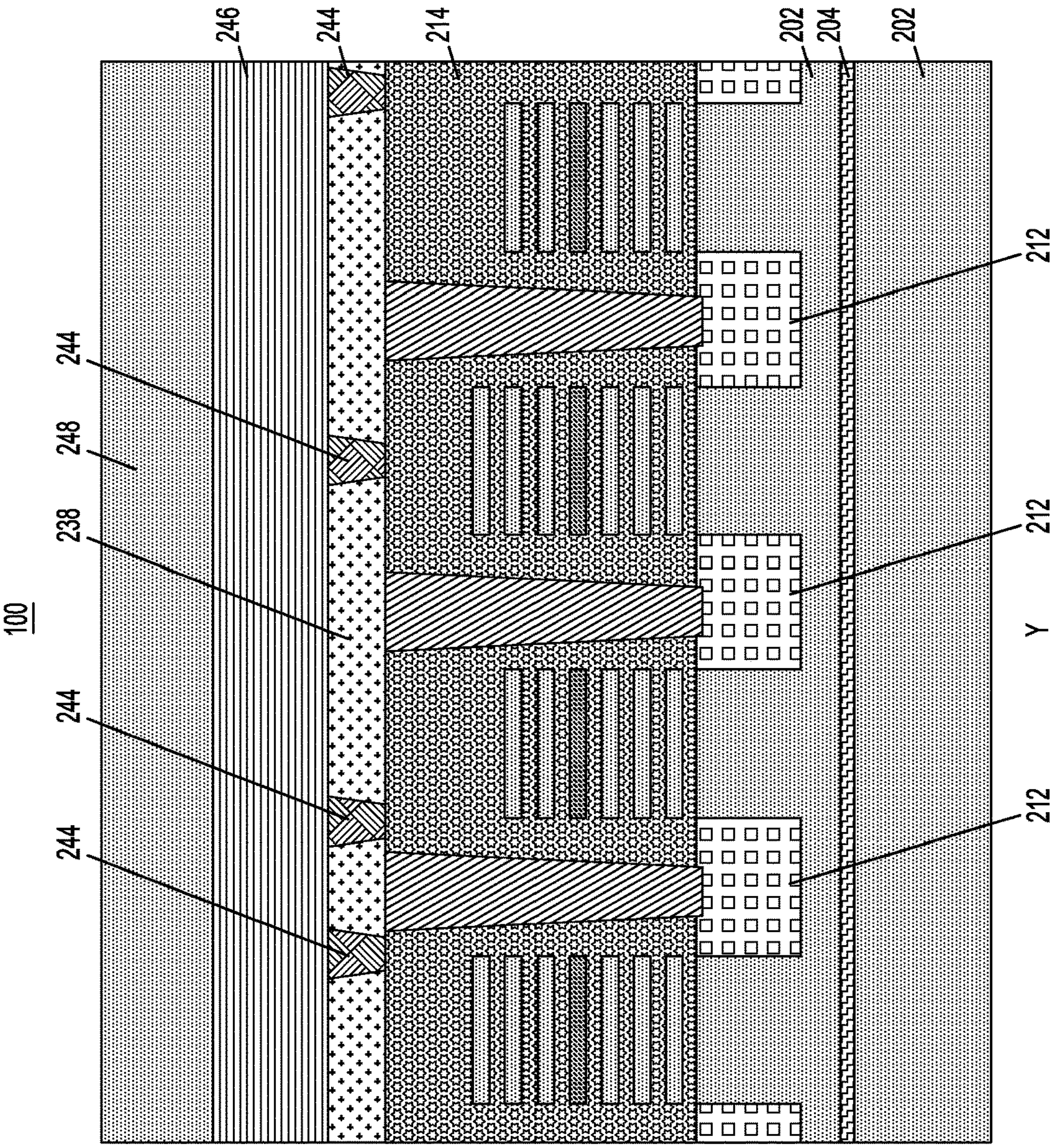
FIG. 6B depicts a second cross-sectional view corresponding to line Y in FIG. 1 illustrating the semiconductor structure following formation of MOL contacts, frontside BEOL interconnects, and carrier wafer bonding, according to an illustrative embodiment.
Figure 6A:
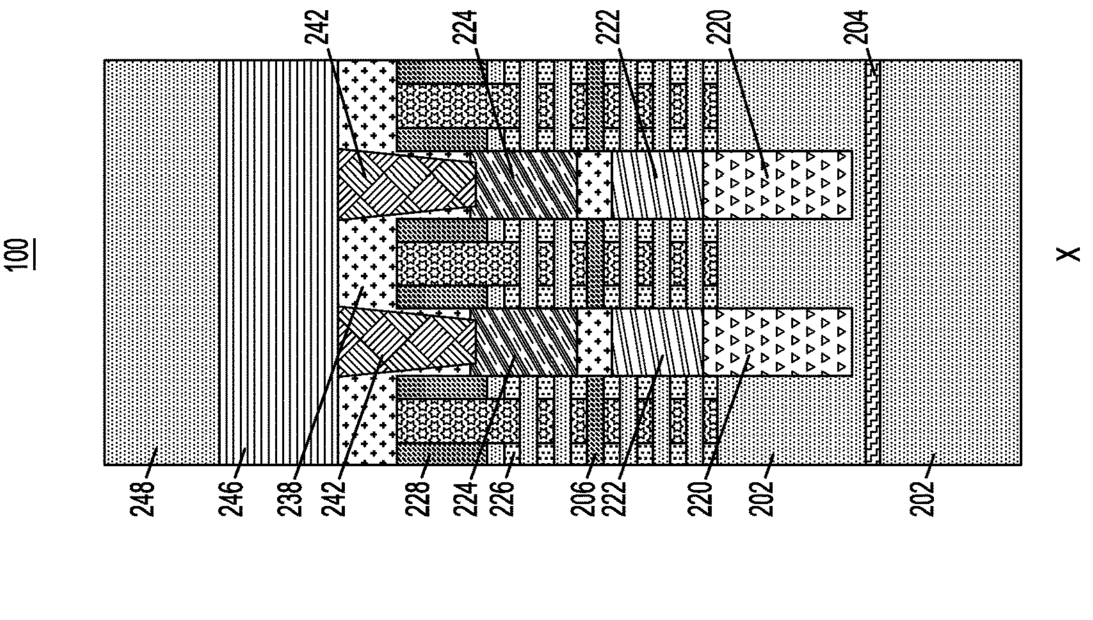
FIG. 6A depicts a first cross-sectional view corresponding to line X in FIG. 1 illustrating the semiconductor structure following formation of middle-of-line (MOL) contacts, frontside back-end-of-line (BEOL) interconnects, and carrier wafer bonding, according to an illustrative embodiment.

FIGS. 6A and 6B show cross-sectional views of the semiconductor structure 100, respectively corresponding to lines X and Y in FIG. 1, following formation of MOL contacts, frontside BEOL interconnects, and carrier wafer bonding, according to an illustrative embodiment. Formation of the MOL contacts, the frontside BEOL interconnects and the carrier wafer bonding can include formation of an ILD layer 238, top source/drain contacts 242, gate contacts 244, frontside BEOL interconnects 246 and bonding of the structure (e.g., the frontside BEOL interconnects 246) to a carrier wafer 248.

The ILD layer 238 may be formed of materials similar to that of the ILD layer 218. The ILD layer 238 may have a height in the range of 20 to 100 nm, for example.

The top source/drain contacts 242, and the gate contacts 244 may include a silicide layer such as titanium (Ti), nickel (Ni), nickel platinum (NiPt), etc., and a metal adhesion layer (e.g., such as TiN) and a low resistance metal such as ruthenium (Ru), tungsten (W), cobalt (Co) or another suitable material.

Each of the top source/drain contacts 242 and the gate contacts 244 may have a width in the range of 8 to 50 nm, and a height that extends from the bottom surface of the frontside BEOL interconnects 246 to the portion of the structure it contacts (e.g., the top source/drain regions 224 for the top source/drain contact 242, and the gate stack layer 214 for the gate contacts 244).

The frontside BEOL interconnects 246 include various BEOL interconnect structures. The carrier wafer 248 may be formed of materials similar to that of the substrate 202, and may be formed over the frontside BEOL interconnects 246 using a wafer bonding process, such as dielectric-to-dielectric bonding.

Figure 7B:
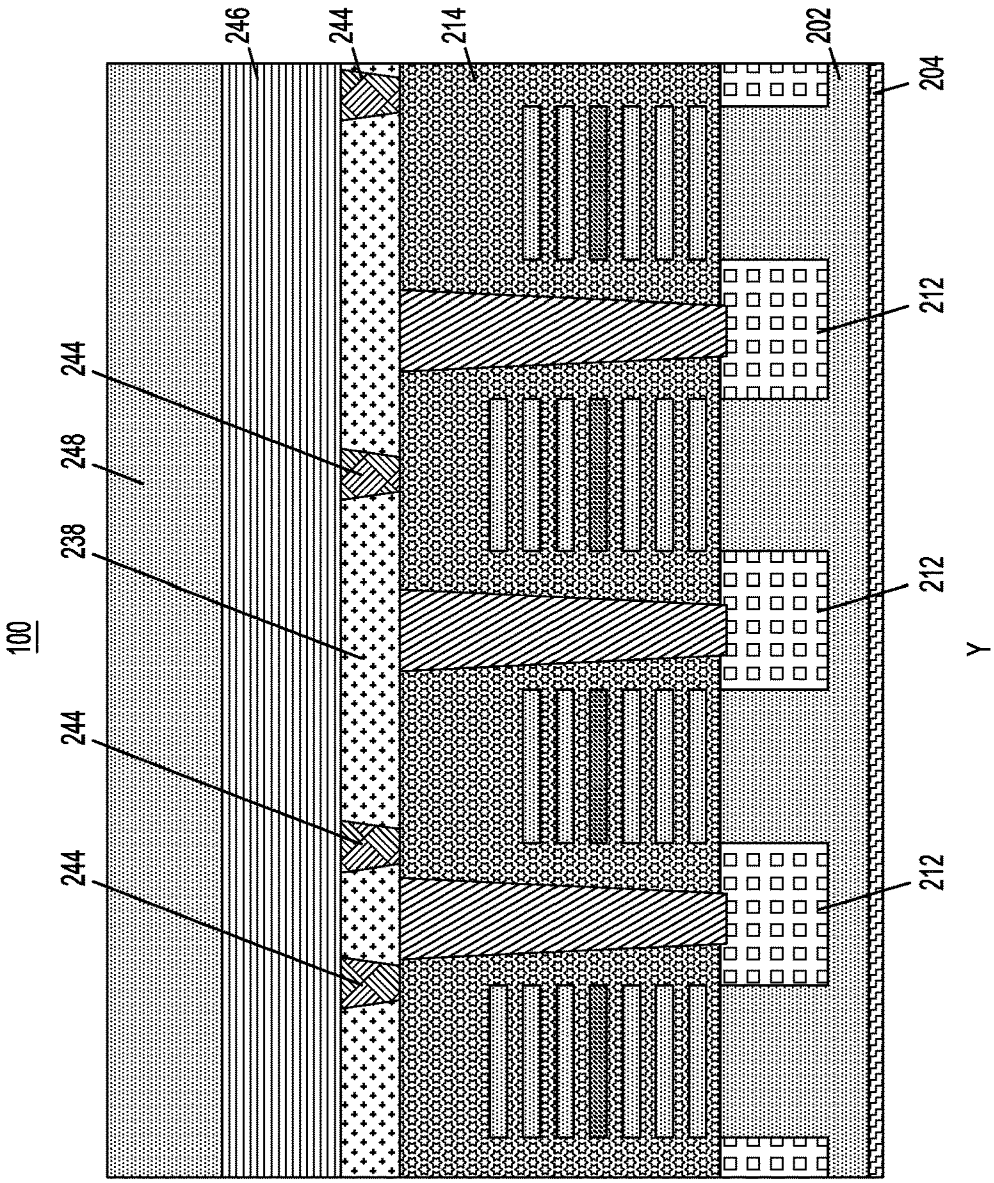
FIG. 7B depicts a second cross-sectional view corresponding to line Y in FIG. 1 illustrating the semiconductor structure following removal of the substrate to the etch stop layer, according to an illustrative embodiment.
Figure 7A:
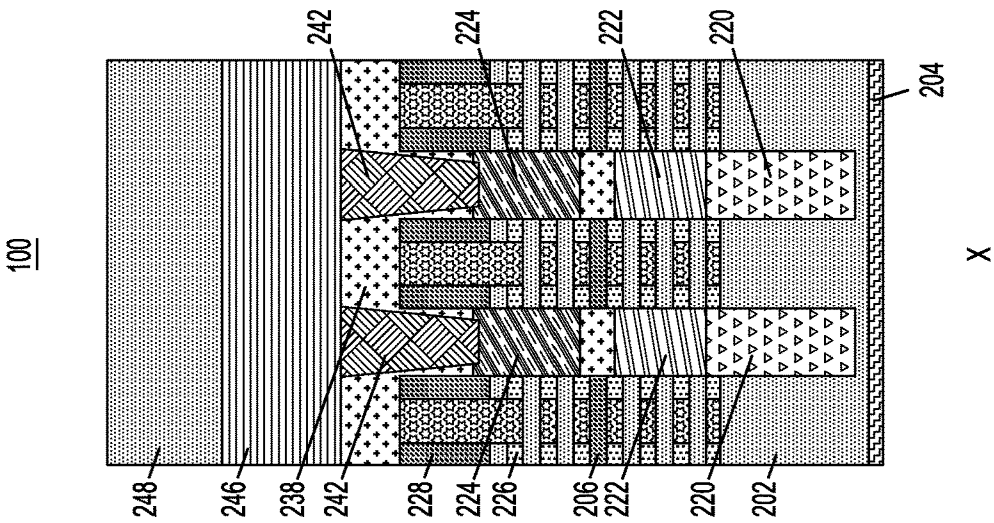
FIG. 7A depicts a first cross-sectional view corresponding to line X in FIG. 1 illustrating the semiconductor structure following removal of substrate to an etch stop layer, according to an illustrative embodiment.

FIGS. 7A and 7B show cross-sectional views of the semiconductor structure 100, respectively corresponding to lines X and Y in FIG. 1, following removal of the substrate 202 to the etch stop layer 204, according to an illustrative embodiment. Using the carrier wafer 248, the structure may be "flipped" and portions of the substrate 202 may be removed from the back side of the semiconductor structure 100. For example, the substrate 202 can be selectively etched with an etchant that selectively etches silicon with respect to the material of the etch stop layer 204. Accordingly, removal of the portions of the substrate 202 will stop on the etch stop layer 204 as illustrated in FIGS. 7A-7B.

Figure 8B:
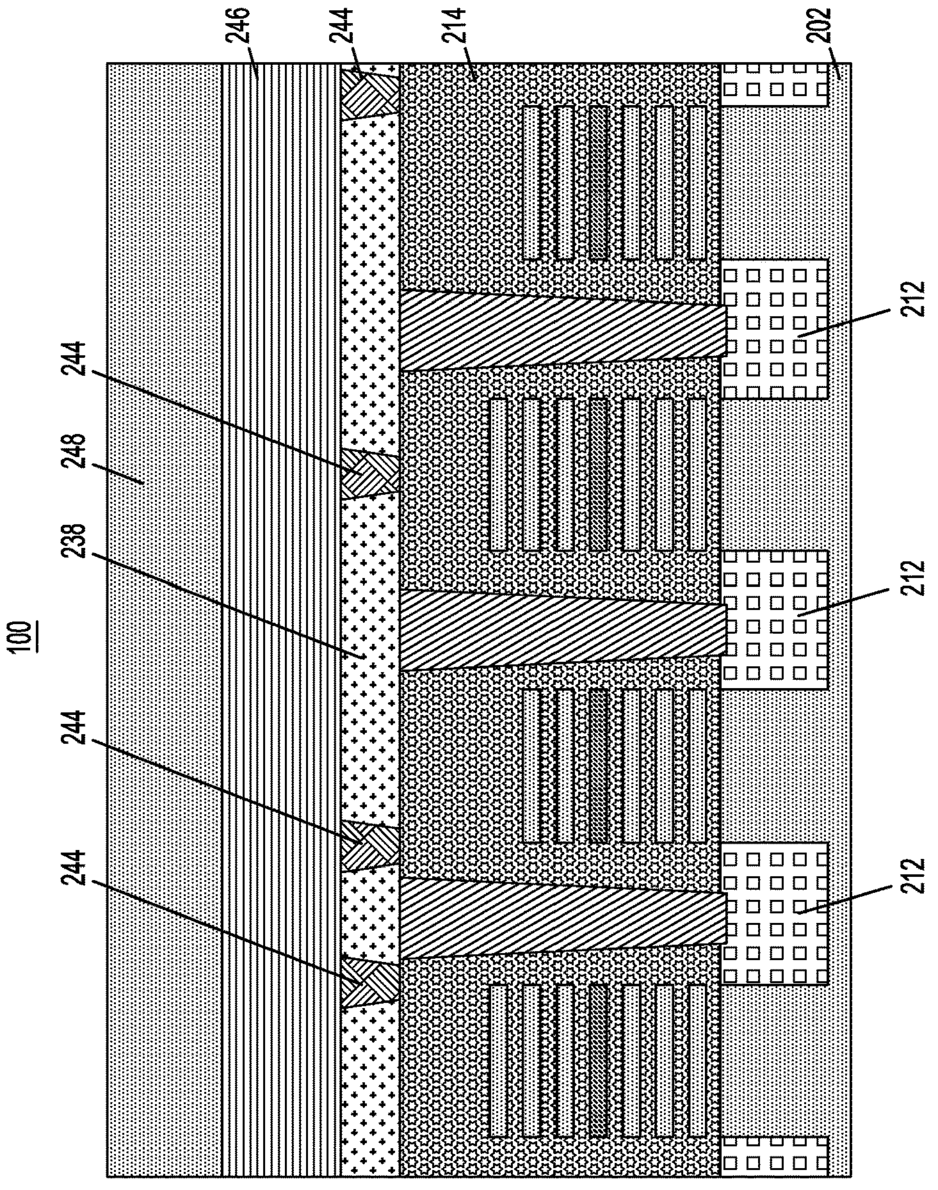
FIG. 8B depicts a second cross-sectional view corresponding to line Y in FIG. 1 illustrating the semiconductor structure following removal of the etch stop layer and recessing of the substrate, according to an illustrative embodiment.
Figure 8A:
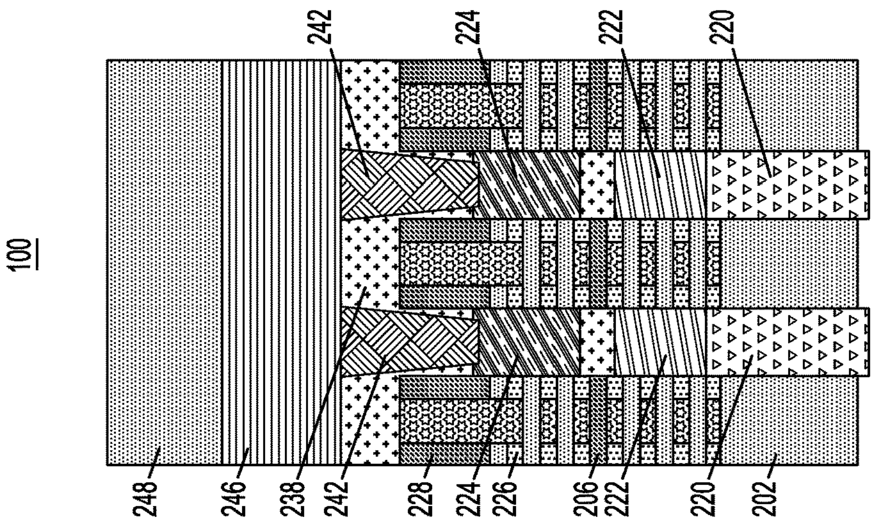
FIG. 8A depicts a first cross-sectional view corresponding to line X in FIG. 1 illustrating the semiconductor structure following removal of the etch stop layer and recessing of the substrate, according to an illustrative embodiment.

FIGS. 8A and 8B show cross-sectional views of the semiconductor structure 100, respectively corresponding to lines X and Y in FIG. 1, following removal of the etch stop layer 204 and recessing of the substrate 102, according to an illustrative embodiment. As shown in FIGS. 8A and 8B, the etch stop layer 204 is removed, followed by recessing of the substrate 202 to expose the bottom portions of the sacrificial placeholders 220.

Figure 9B:
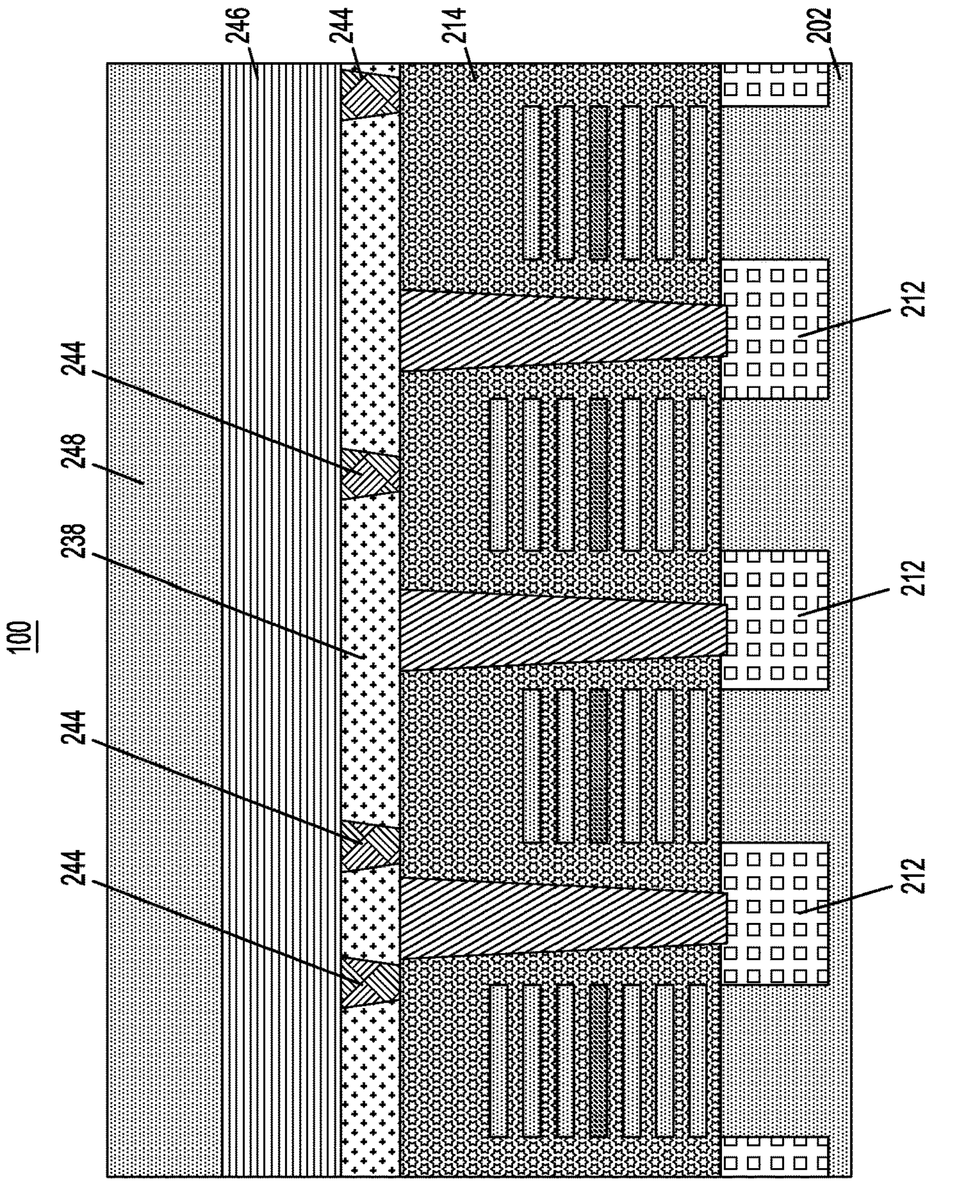
FIG. 9B depicts a second cross-sectional view corresponding to line Y in FIG. 1 illustrating the semiconductor structure following the placeholder recess and the protective cap formation, according to an illustrative embodiment.
Figure 9A:
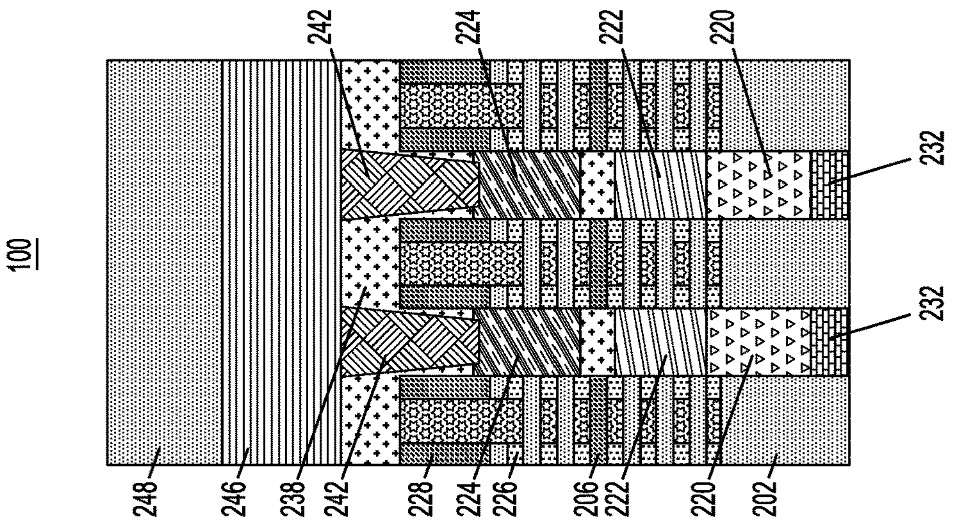
FIG. 9A depicts a first cross-sectional view corresponding to line X in FIG. 1 illustrating the semiconductor structure following placeholder recess and protective cap formation, according to an illustrative embodiment.

FIGS. 9A and 9B show cross-sectional views of the semiconductor structure 100, respectively corresponding to lines X and Y in FIG. 1, following recessing of the sacrificial placeholders 220 and formation of protective caps 232, according to an illustrative embodiment. The sacrificial placeholders 220 may be recessed using any suitable etch processing that removes the material of the sacrificial placeholders 220 selective to that of the rest of the structure. Protective caps 232 are formed in the recessed areas of the sacrificial placeholders 220. The protective caps 232 can be formed of a material such as SiC, $SiO_2$, $TiO_x$, aluminum nitride (AlN), as non-limiting examples.

Figure 10B:
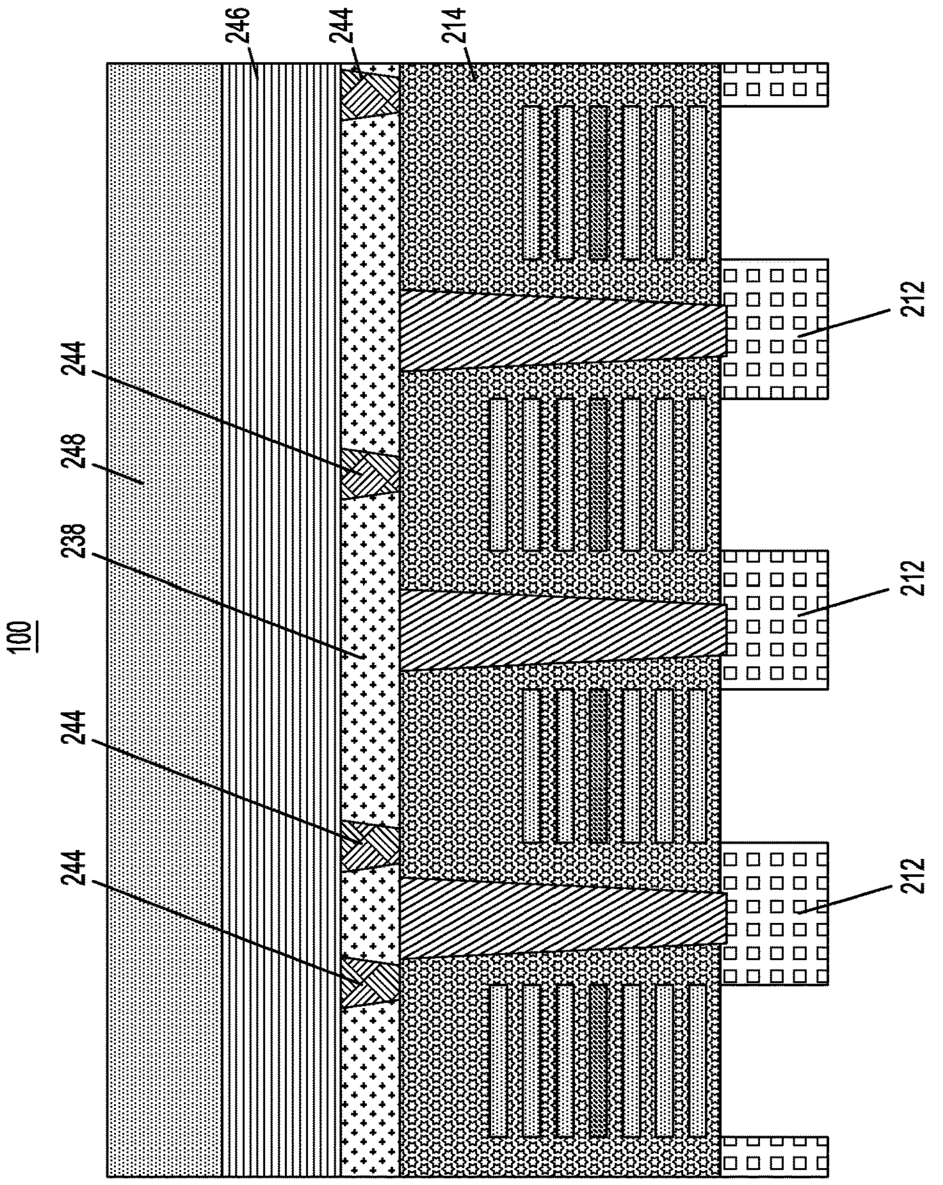
FIG. 10B depicts a second cross-sectional view corresponding to line Y in FIG. 1 illustrating the semiconductor structure following removal of the remaining substrate, according to an illustrative embodiment.
Figure 10A:
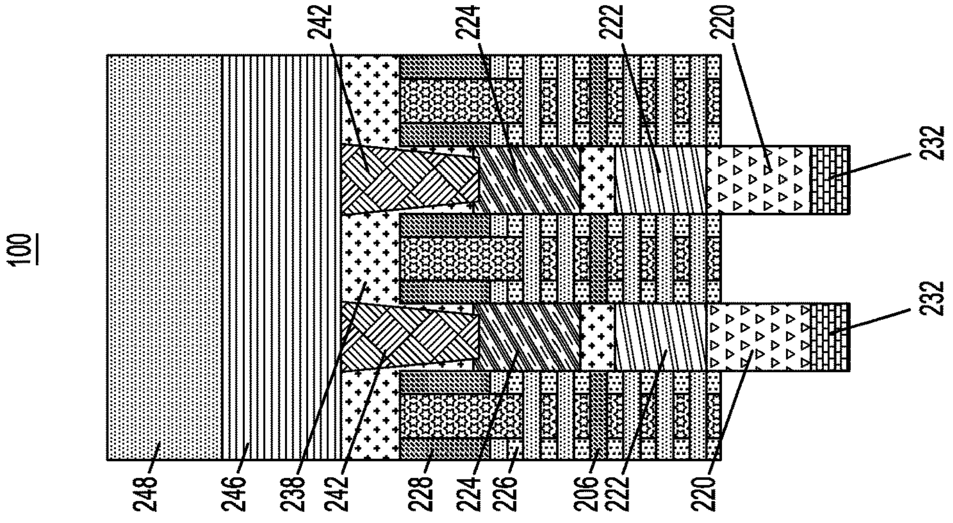
FIG. 10A depicts a first cross-sectional view corresponding to line X in FIG. 1 illustrating the semiconductor structure following placeholder recess and protective cap formation, according to an illustrative embodiment.

FIGS. 10A and 10B show cross-sectional views of the semiconductor structure 100, respectively corresponding to lines X and Y in FIG. 1, following removal of the remaining substrate, according to an illustrative embodiment. As shown in FIGS. 10A and 10B, the etch stop the remaining portions of the substrate 202 are removed to expose the bottom surface of the gate layer 214, the protective caps 232 and portions of the sacrificial placeholders 220.

Figure 11B:
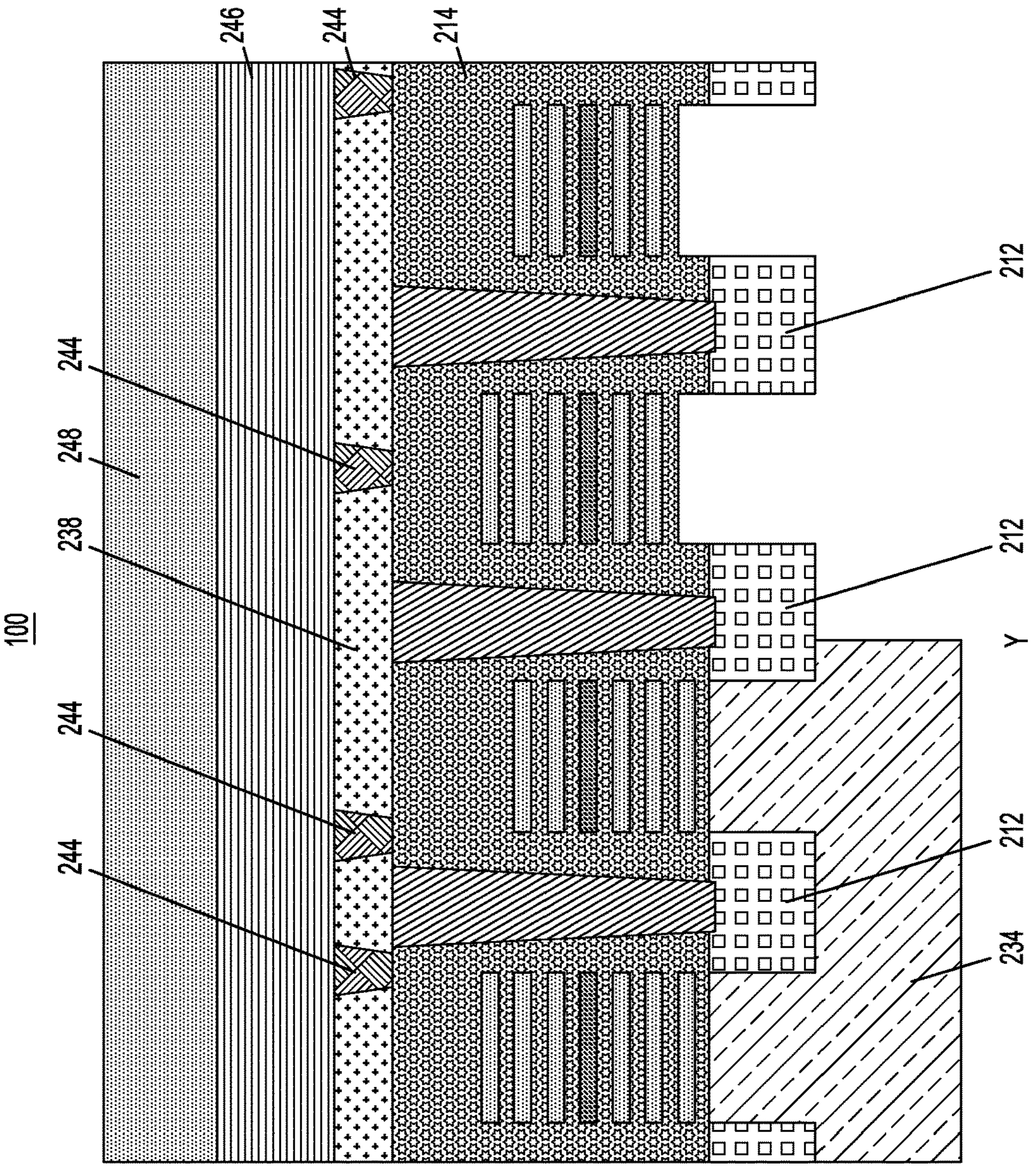
FIG. 11B depicts a second cross-sectional view corresponding to line Y in FIG. 1 illustrating the semiconductor structure following the bottom channel depopulation process, according to an illustrative embodiment.
Figure 11A:
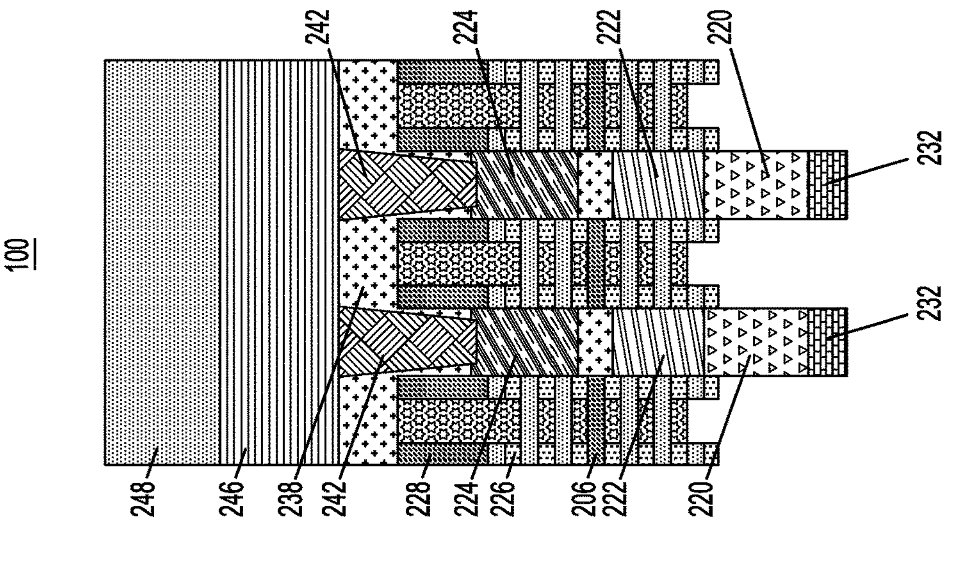
FIG. 11A depicts a first cross-sectional view corresponding to line X in FIG. 1 illustrating the semiconductor structure following a bottom channel depopulation process, according to an illustrative embodiment.

FIGS. 11A and 11B show cross-sectional views of the semiconductor structure 100, respectively corresponding to lines X and Y in FIG. 1, following a bottom channel depopulation process, according to an illustrative embodiment. The bottom channel depopulation process can include depositing and selectively etching a bottom mask layer 240. For example, the bottom mask layer 240 may be deposited and masked similarly as described above with respect to mask layer 234 so that one or more portions of the bottommost nanosheet channel layers 208-1 are exposed. The bottom mask layer 240 is deposited and etched such that it covers the bottom portions of stacked cells 101-1 and 101-2 between the corresponding isolation regions 212, as shown in FIGS. 11A and 11B. In this example, the bottom channel depopulation process includes removing portions of the gate layer 214 and the bottommost nanosheet channel layers 208-1.

Figure 12B:
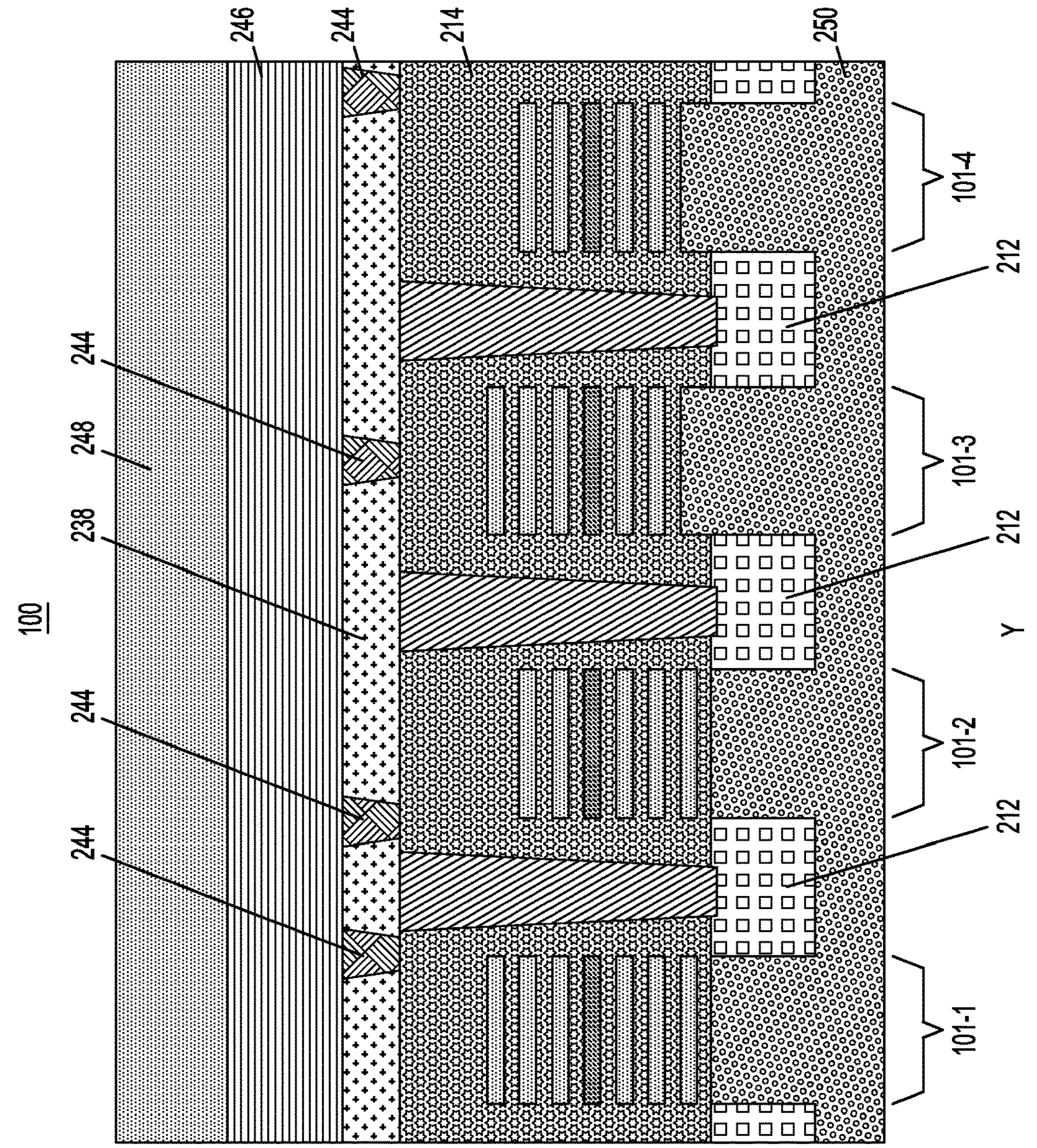
FIG. 12B depicts a second cross-sectional view corresponding to line Y in FIG. 1 illustrating the semiconductor structure following the mask layer removal and the ILD layer formation, according to an illustrative embodiment.
Figure 12A:
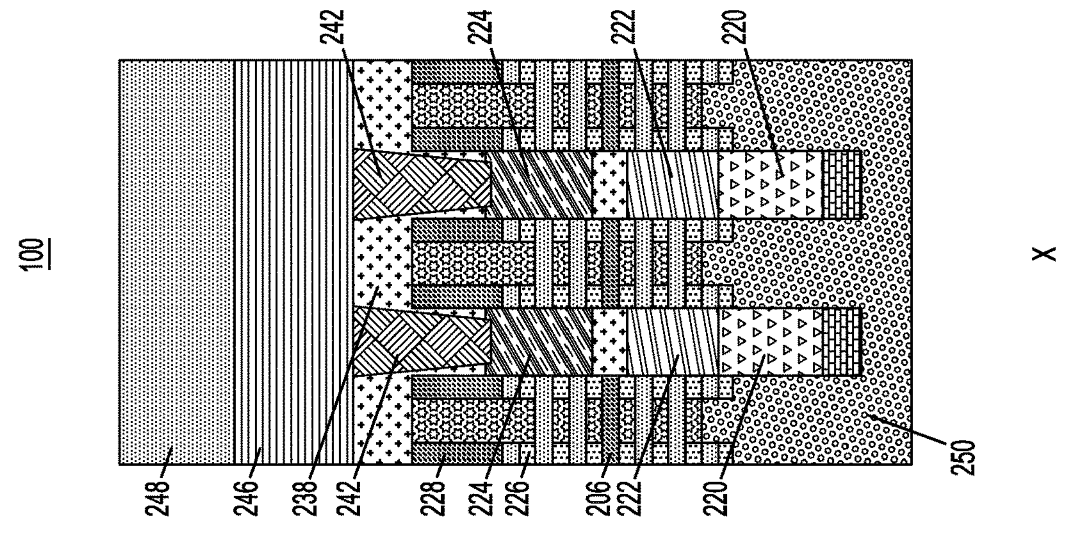
FIG. 12A depicts a first cross-sectional view corresponding to line X in FIG. 1 illustrating the semiconductor structure following mask layer removal and backside interlayer dielectric (ILD) layer formation, according to an illustrative embodiment.

FIGS. 12A and 12B show cross-sectional views of the semiconductor structure 100, respectively corresponding to lines X and Y in FIG. 1, following removal of the bottom mask layer 240 and formation of a backside ILD layer 250, according to an illustrative embodiment.

The backside ILD layer 250 may be formed of similar materials as the ILD layer 238, for example. In some embodiments, the material of the backside ILD layer 250 may initially be overfilled, followed by a planarization process (e.g., using CMP) so that the backside ILD layer 250 surrounds the sacrificial placeholders 220, and the protective caps 232 as shown.

Figure 13B:
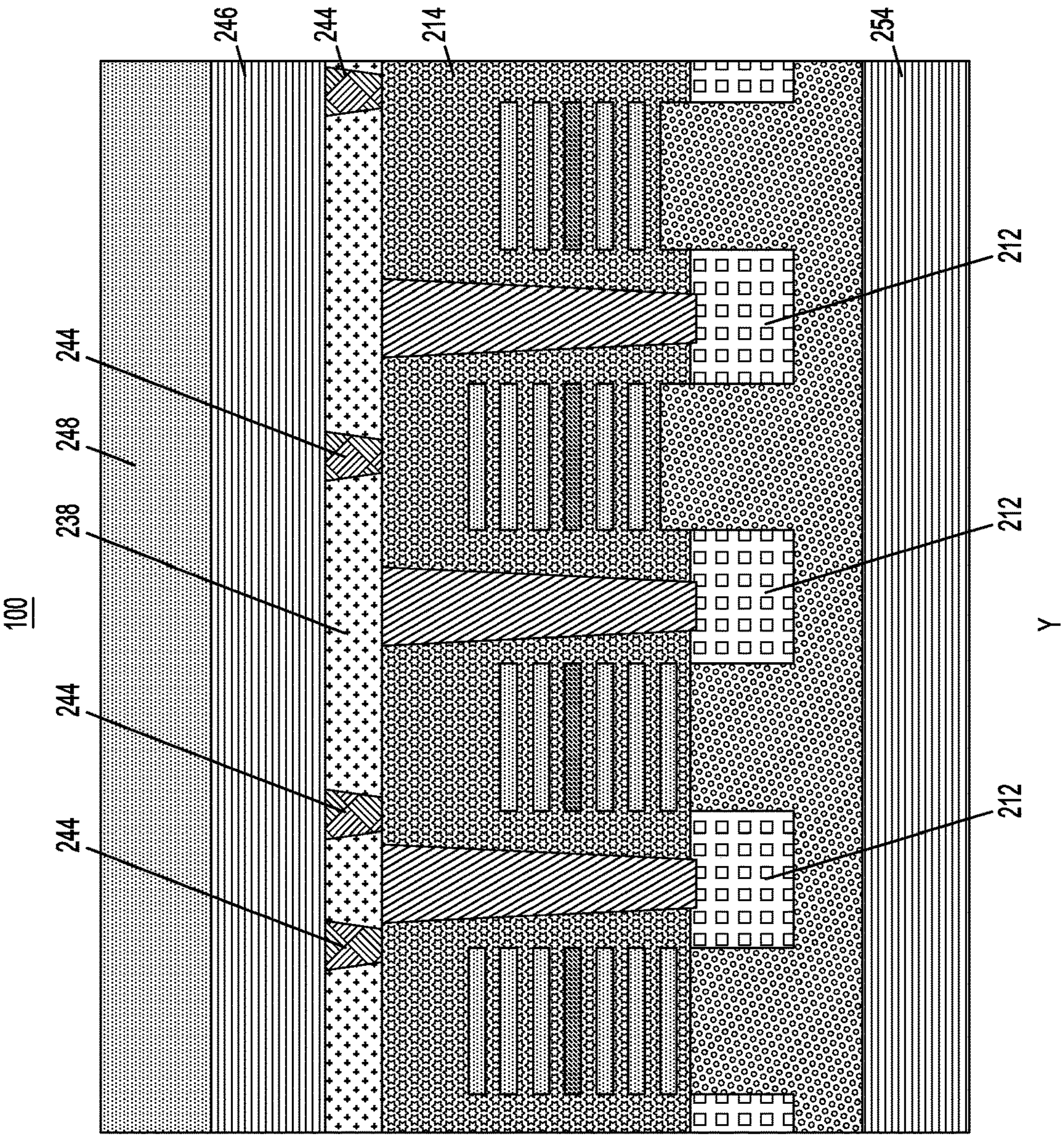
FIG. 13B depicts a second cross-sectional view corresponding to line Y in FIG. 1 illustrating the semiconductor structure following the backside contact formation and the backside interconnect formation, according to an illustrative embodiment.
Figure 13A:
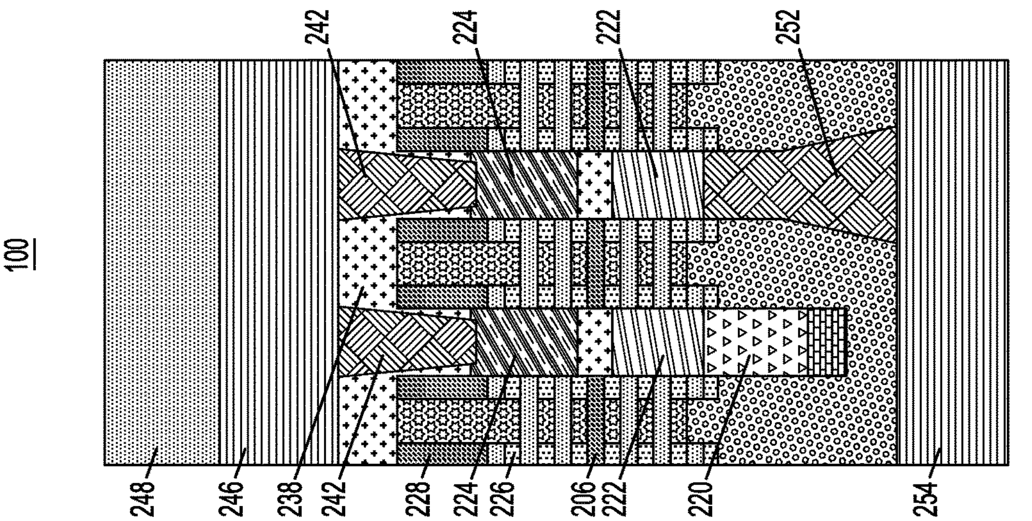
FIG. 13A depicts a first cross-sectional view corresponding to line X in FIG. 1 illustrating the semiconductor structure following backside contact formation and backside interconnect formation, according to an illustrative embodiment.

FIGS. 13A and 13B show cross-sectional views of the semiconductor structure 100, respectively corresponding to lines X and Y in FIG. 1, illustrating the semiconductor structure following backside contact formation and backside interconnect formation, according to an illustrative embodiment. To form the structure shown in FIGS. 13A and 13B, the sacrificial placeholder 220 may be removed using any suitable etch processing that removes the material of the sacrificial placeholders 220 selective to that of the rest of the structure.

The backside bottom source/drain contact 252 may then be formed by fill and planarization of contact material. The contact material of the backside bottom source/drain contact 252 may be similar to that of the top source/drain contact 242 and gate contacts 244. The backside bottom source/drain contact 252 may have a width matching that of the bottom source/drain regions 222, for example.

Figure 14:
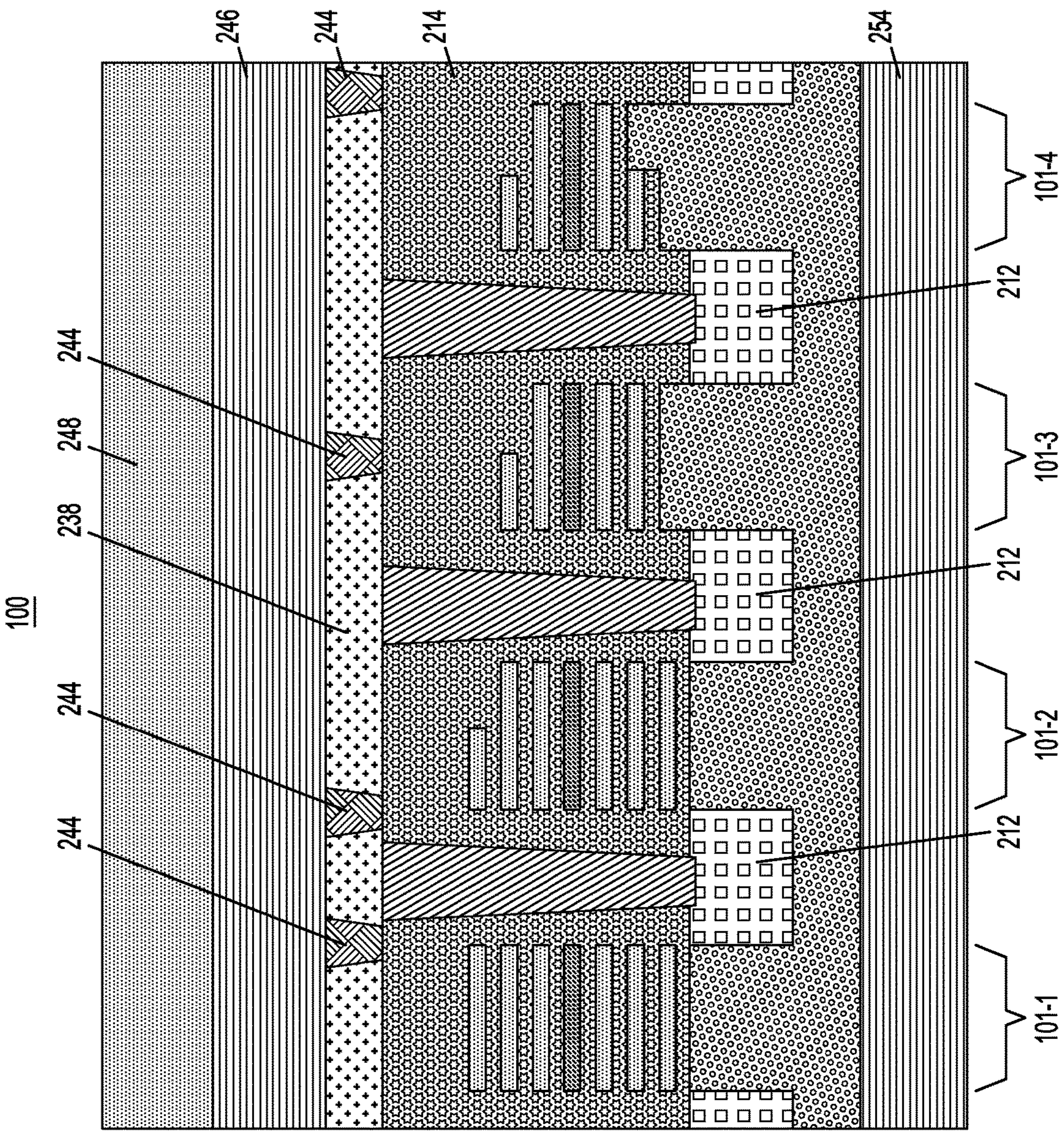
FIG. 14 depicts another example of a semiconductor structure comprising nanosheets having different widths, according to an illustrative embodiment.

FIG. 14 depicts another example of a semiconductor structure comprising nanosheets having different widths, according to an illustrative embodiment. FIG. 14 shows a cross-sectional view of a semiconductor that is similar to the semiconductor structure 100 shown in FIG. 13B, except some of the channel layers 208 have different widths. More specifically, the channel layers 208-1 of stacked cell 101-2 include two full width channel layers and a half-width channel layer. It is to be appreciated that numerous other arrangements are also possible, such as channel layers 208 having three or more widths. It is to be appreciated that forming channel layers having different widths can include forming an additional mask (e.g., using OPL as a soft mask) before dummy gate removal or before sacrificial SiGe removal to expose the channel, and then etching out a portion of the channel.

In some embodiments, the above-described techniques are used in connection with semiconductor devices that may require or otherwise utilize, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor.

Typically, it is technically challenging to enable different number of nanosheet layers to be used in the same stacked architecture due to the etch height differences between contacts. Without in any way limiting the scope, interpretation, or application of the claims appearing below, a technical effect of one or more of the example embodiments disclosed herein is improving power tuning and/or beta ratios by allowing different number of nanosheet layers to be used in the same stacked architecture. For example, certain arcs in a design may require faster or stronger pull down devices than pull up devices, whereas faster and/or stronger pull up devices may be desired in other designs. Embodiments described herein enable widths of NFET and/or PFET devices to be individually tuned to improve performance. Also, the total effective width for devices that are not critical for timing can be reduced, which is generally accomplished by depopulating a fin in FinFET device or reducing the width of a sheet for nanosheet technologies. At least some of the embodiments described herein provide even more granularity as the width of individual sheets can be trimmed while other sheets can remain wider.

In some embodiments, a semiconductor device comprises a first SFET structure comprising a first lower FET device and a first upper FET device, and a second SFET structure comprising a second lower FET device and a second upper FET device. The first lower FET device can include a different number of channel layers than the second lower FET device. Alternatively or additionally, the first upper FET device can include a different number of channel layers than the second upper FET device.

The first lower field-effect transistor and the first upper field-effect transistor device may include a same number of channel layers. At least some of the channel layers in the first stacked field-effect transistor structure may have different widths. At least one of the first and second upper FET devices may include at least one first upper channel layer and at least one second upper channel layer having different widths. At least one of the first and second lower FET devices may include at least one first lower channel layer and at least one second lower channel layer having different widths. The channel layers corresponding to the first upper FET device, the channel layers corresponding to the first lower FET device, and an isolation layer disposed between the first lower FET device and the first upper FET device may be alternately stacked with a plurality of gate structures of the first SFET structure.

In some embodiments, a semiconductor device comprises a plurality of stacked device structures comprising two or more upper devices, each comprising one or more upper channel layers, and two or more lower devices, each comprising one or more lower channel layers. A first number of upper channel layers of a first one of the two or more upper devices is different than a second number of upper channel layers of a second one of the two or more upper devices. A third of lower channel layers of a first one of the two or more lower devices is different than a fourth number of lower channel layers of a second one of the two or more lower devices.

At least one of the upper devices may include at least one first upper channel layer and at least one second upper channel layer having different widths. At least one of the lower devices may include at least one first lower channel layer and at least one second lower channel layer having different widths. A given one of the stacked device structures may include an isolation layer disposed between the one or more upper devices and the one or more lower devices of the given stacked device structure. The first and second upper devices and the first and second lower devices may include respective FET devices. The first and second upper devices and the first and second lower devices may include respective nanosheet FET devices. A first stacked device structure and a second stacked device structure may provide a complementary FET structure. One of the first upper device and the first lower device in the first stacked device structure may include an n-type FET device and the other one of the first upper device and the second lower device in the first stacked device structure may include a p-type FET device.

In some embodiments, a method includes forming first and second SFET device structures, each of the first and second SFET device structures comprising a plurality of channel layers corresponding to an upper FET device and a lower FET device. The method also includes removing at least one channel layer from the plurality of channel layers of the first stacked field-effect transistor device structure, where the removing results in at least one of: a first number of channel layers of the lower field-effect transistor device corresponding to the first stacked field-effect transistor device structure being different than a second number of channel layers of the lower field-effect transistor device corresponding to the second stacked field-effect transistor device; and a third number of channel layers of the upper field-effect transistor device corresponding to the first stacked field-effect transistor device structure being different than a fourth number of channel layers of the upper field-effect transistor device corresponding to the second stacked field-effect transistor device.

Removing the at least one channel layer from the plurality of channel layers of the first SFET device structure may include forming a mask layer to cover at least the upper FET device of the second SFET device structure, performing a first etching process that through the at least one channel layer corresponding to the upper field-effect transistor device of the first stacked field-effect transistor device structure, and performing a second etching process to remove at least the mask layer. The method may further include forming a gate stack layer around the remaining channel layers of the first and second SFET device structures. Removing the at least one channel layer from the plurality of channel layers of the first SFET device structure may include forming a mask layer to cover at least the lower FET device of the second SFET device structure, performing a first etching process that etches through a portion of a gate stack layer and the at least one channel layer corresponding to the lower field-effect transistor device of the first stacked field-effect transistor device structure, and performing a second etching process to remove at least the mask layer. The method may include forming a dielectric layer that covers exposed portions of the gate stack layer of the first SFET device structure and a gate stack layer of the first SFET device structure resulting from the first and second etching processes. The lower FET devices may include one of n-type FET devices and p-type FET devices, and the upper FET devices may include the other one of the n-type FET devices and the p-type FET devices.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "approximately" or "substantially" as used herein with regard to thicknesses, widths, percentages, ranges, temperatures, times and other process parameters, etc., are meant to denote being close or approximate to, but not exactly. For example, the term "approximately" or "substantially" as used herein implies that a small margin of error is present, such as ±5%, preferably less than 2% or 1% or less than the stated amount.

In the description above, various materials, dimensions and processing parameters for different elements are provided. Unless otherwise noted, such materials are given by way of example only and embodiments are not limited solely to the specific examples given. Similarly, unless otherwise noted, all dimensions and process parameters are given by way of example and embodiments are not limited solely to the specific dimensions or ranges given.

The descriptions of the various embodiments described herein have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:

a first stacked field-effect transistor structure comprising a first lower field-effect transistor device and a first upper field-effect transistor device; and a second stacked field-effect transistor structure comprising a second lower field-effect transistor device and a second upper field-effect transistor device;

wherein at least one of: the first lower field-effect transistor device comprises a different number of channel layers than the second lower field-effect transistor device; and the first upper field-effect transistor device comprises a different number of channel layers than the second upper field-effect transistor device; and wherein the first stacked field-effect transistor structure comprises a gate stack layer extending continuously through the first stacked field-effect transistor structure and wrapping around each channel layer of the first lower field-effect transistor device and each channel layer of the first upper field-effect transistor device.

2. The semiconductor device of claim 1, wherein the first lower field-effect transistor device and the first upper field-effect transistor device comprise a same number of channel layers.

3. The semiconductor device of claim 2, wherein at least some of the channel layers in the first stacked field-effect transistor structure have different widths.

4. The semiconductor device of claim 1, wherein at least one of the first and second upper field-effect transistor devices comprises at least one first upper channel layer and at least one second upper channel layer having different widths.

5. The semiconductor device of claim 1, wherein at least one of the first and second lower field-effect transistor devices comprises at least one first lower channel layer and at least one second lower channel layer having different widths.

6. The semiconductor device of claim 1, wherein the channel layers corresponding to the first upper field-effect transistor device, the channel layers corresponding to the first lower field-effect transistor device, and an isolation layer disposed between the first lower field-effect transistor device and the first upper field-effect transistor device are alternately stacked with portions of the gate stack layer of the first stacked field-effect transistor structure.

7. A semiconductor device comprising:

a plurality of stacked device structures comprising two or more upper devices, each comprising one or more upper channel layers, and two or more lower devices, each comprising one or more lower channel layers;

wherein a first number of upper channel layers of a first one of the two or more upper devices is different than a second number of upper channel layers of a second one of the two or more upper devices; and wherein a third number of lower channel layers of a first one of the two or more lower devices is different than a fourth number of lower channel layers of a second one of the two or more lower devices, and wherein a given one of the plurality of stacked device structures comprises a gate stack layer extending continuously through the given stacked device structure and wrapping around each of the one or more upper channel layers and each of the one or more lower channel layers of the given stacked device structure.

8. The semiconductor device of claim 7, wherein at least one of the upper devices comprises at least one first upper channel layer and at least one second upper channel layer having different widths.

9. The semiconductor device of claim 7, wherein at least one of the lower devices comprises at least one first lower channel layer and at least one second lower channel layer having different widths.

10. The semiconductor device of claim 7, wherein a given one of the stacked device structures comprises an isolation layer disposed between channel layers of the one or more upper devices and channel layers of the one or more lower devices of the given stacked device structure.

11. The semiconductor device of claim 7, wherein the first and second upper devices and the first and second lower devices comprise respective field-effect transistor devices.

12. The semiconductor device of claim 7, wherein the first and second upper devices and the first and second lower devices comprise respective nanosheet field-effect transistor devices.

13. The semiconductor device of claim 7, wherein a first stacked device structure and a second stacked device structure provide a complementary field-effect transistor structure.

14. The semiconductor device of claim 13, wherein one of the first upper device and the first lower device in the first stacked device structure comprises an n-type field-effect transistor device and the other one of the first upper device and the first lower device in the first stacked device structure comprises a p-type field-effect transistor device.

15. A method comprising:

forming first and second stacked field-effect transistor device structures, each of the first and second stacked field-effect transistor device structures comprising a plurality of channel layers corresponding to an upper field-effect transistor device and a lower field-effect transistor device;

removing at least one channel layer from the plurality of channel layers of the first stacked field-effect transistor device structure, wherein the removing results in at least one of: a first number of channel layers of the lower field-effect transistor device corresponding to the first stacked field-effect transistor device structure being different than a second number of channel layers of the lower field-effect transistor device corresponding to the second stacked field-effect transistor device structure; and a third number of channel layers of the upper field-effect transistor device corresponding to the first stacked field-effect transistor device structure being different than a fourth number of channel layers of the upper field-effect transistor device corresponding to the second stacked field-effect transistor device structure; and forming, in each of the first stacked field-effect transistor device structure and the second stacked field-effect transistor device structure, a gate stack layer extending continuously through the stacked field-effect transistor device structure and wrapping around each remaining channel layer of the lower field-effect transistor device and each remaining channel layer of the upper field-effect transistor device.

16. The method of claim 15, wherein removing the at least one channel layer from the plurality of layers of the first stacked field-effect transistor device structure comprises:

forming a mask layer to cover at least the upper field-effect transistor device of the second stacked field-effect transistor device structure;

performing a first etching process that etches through the at least one channel layer, corresponding to the upper field-effect transistor device of the first stacked field-effect transistor device structure; and performing a second etching process to remove at least the mask layer.

17. The method of claim 16, wherein forming the gate stack layer comprises:

forming a gate dielectric layer comprising a high-k dielectric material around the remaining channel layers of the first and second stacked field-effect transistor device structures.

18. The method of claim 15, further comprising removing at least one additional channel layer from the plurality of channel layers of the first stacked field-effect transistor device structure following forming the gate stack layer, wherein removing the at least one additional channel layer comprises:

forming a mask layer to cover at least the lower field-effect transistor device of the second stacked field-effect transistor device structure; performing a first etching process that etches through a portion of the gate stack layer and the at least one additional channel layer corresponding to the lower field-effect transistor device of the first stacked field-effect transistor device structure;

and performing a second etching process to remove at least the mask layer.

19. The method of claim 18, further comprising:

forming a dielectric layer that covers exposed portions of the gate stack layer of the first stacked field-effect transistor device structure and a gate stack layer of the second stacked field-effect transistor device structure resulting from the first and second etching processes.

20. The method of claim 15, wherein the lower field-effect transistor devices comprise one of n-type field-effect transistor devices and p-type field-effect transistor devices, and the upper field-effect transistor devices comprise the other one of the n-type field-effect transistor devices and the p-type field-effect transistor devices.

* * * * *